(12) United States Patent
Jeong

(10) Patent No.: US 10,199,431 B2
(45) Date of Patent: Feb. 5, 2019

(54) MAGNETIC MEMORY DEVICES

(71) Applicant: Daeeun Jeong, Yongin-si (KR)

(72) Inventor: Daeeun Jeong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/648,772

(22) Filed: Jul. 13, 2017

(65) Prior Publication Data

US 2018/0197914 A1 Jul. 12, 2018

(30) Foreign Application Priority Data

Jan. 10, 2017 (KR) .......................... 10-2017-0003663

(51) Int. Cl.
| | |
|---|---|
| H01L 43/02 | (2006.01) |
| H01L 27/22 | (2006.01) |
| H01L 43/08 | (2006.01) |
| H01L 23/528 | (2006.01) |
| H01L 23/522 | (2006.01) |
| H01L 43/12 | (2006.01) |

(52) U.S. Cl.
CPC .......... *H01L 27/222* (2013.01); *H01L 23/528* (2013.01); *H01L 23/5226* (2013.01); *H01L 43/02* (2013.01); *H01L 43/08* (2013.01); *H01L 43/12* (2013.01)

(58) Field of Classification Search
CPC . H01L 27/222; H01L 23/5226; H01L 23/528; H01L 43/02; H01L 43/08; H01L 43/12
See application file for complete search history.

(56) References Cited

U.S. PATENT DOCUMENTS

| | | | |
|---|---|---|---|
| 7,001,783 B2 | 2/2006 | Costrini et al. | |
| 7,531,367 B2 | 5/2009 | Assefa et al. | |
| 7,936,027 B2 | 5/2011 | Xiao et al. | |
| 8,574,928 B2 | 11/2013 | Satoh et al. | |
| 8,722,543 B2 | 5/2014 | Belen et al. | |
| 8,962,349 B1 | 2/2015 | Chen et al. | |
| 8,975,088 B2 | 3/2015 | Satoh et al. | |
| 2015/0069560 A1* | 3/2015 | Cho | H01L 43/02 257/421 |
| 2016/0284985 A1* | 9/2016 | Shen | H01L 43/12 |
| 2016/0351798 A1* | 12/2016 | Shen | H01L 43/12 |

* cited by examiner

*Primary Examiner* — Fazli Erdem
(74) *Attorney, Agent, or Firm* — Harness, Dickey & Pierce, P.L.C.

(57) ABSTRACT

A device that includes a magnetic memory device, includes a magnetic tunnel junction pattern on a substrate and a mask structure on the magnetic tunnel junction pattern. The mask structure includes a conductive pattern and a sacrificial pattern, where the conductive pattern is between the magnetic tunnel junction pattern and the sacrificial pattern, and the sacrificial pattern includes a material having an etch selectivity with respect to the conductive pattern. The device includes an upper contact plug in contact with a surface of the conductive pattern of the mask structure. The device includes a lower interlayered insulating layer covering a cell region and a peripheral circuit region of the substrate, where the lower interlayered insulating layer on the cell region has a recessed top surface between adjacent magnetic tunnel junction patterns.

17 Claims, 22 Drawing Sheets

MAGNETIC MEMORY DEVICES

CROSS-REFERENCE TO RELATED APPLICATIONS

This U.S. non-provisional patent application claims priority under 35 U.S.C. § 119 to Korean Patent Application No. 10-2017-0003663, filed on Jan. 10, 2017, in the Korean Intellectual Property Office, the entire contents of which are hereby incorporated by reference.

BACKGROUND

The present disclosure relates to magnetic memory devices and methods of fabricating the same, and in particular, to magnetic memory devices including a magnetic tunnel junction and methods of fabricating the same.

Due to an increasing demand for electronic devices with increased speed and/or reduced power consumption, semiconductor devices may be configured to operate with faster operating speeds and/or lower operating voltages. Magnetic memory devices have been suggested to enable such devices. For example, a magnetic memory device can provide technical advantages, such as reduced latency and/or non-volatility. As a result, magnetic memory devices are emerging as next-generation memory devices.

The magnetic memory device includes a magnetic tunnel junction (MTJ) pattern. The MTJ pattern may include two magnetic layers and an insulating layer interposed therebetween. Resistance of the MTJ pattern varies depending on magnetization directions of the magnetic layers. For example, the resistance of the MTJ pattern is higher when magnetization directions of the magnetic layers are anti-parallel to each other than when they are parallel to each other. Such a difference in resistance can be used for data storing operations of the magnetic memory device.

However, more research is still needed to mass-produce the magnetic memory device and satisfy demands for the magnetic memory device with higher integration density and lower power consumption properties.

SUMMARY

Some example embodiments of the inventive concepts provide magnetic memory devices with improved electric characteristics and a method of fabricating the same.

Some example embodiments of the inventive concepts provide a method of easily fabricating a magnetic memory device and a magnetic memory device fabricated thereby.

According to some example embodiments of the inventive concepts, a device may include a magnetic tunnel junction pattern on a substrate, a mask structure including a conductive pattern and a sacrificial pattern, the conductive pattern between the magnetic tunnel junction pattern and the sacrificial pattern, the sacrificial pattern including a material having an etch selectivity with respect to the conductive pattern, and an upper contact plug in contact with a surface of the conductive pattern.

According to some example embodiments of the inventive concepts, a device may include a plurality of magnetic tunnel junction patterns on a substrate, adjacent magnetic tunnel junction patterns of the plurality of magnetic tunnel junction patterns spaced apart from each other in a direction parallel to a top surface of the substrate, and a plurality of mask structures on separate, respective magnetic tunnel junction patterns of the plurality of magnetic tunnel junction patterns. Each mask structure of the plurality of mask structures may include an alternating stack of patterns, the alternating stack of patterns including at least two conductive patterns and at least two sacrificial patterns. Each sacrificial pattern of the at least two sacrificial patterns may include a material having an etch selectivity with respect to the at least two conductive patterns.

According to some example embodiments of the inventive concepts, a device may include a substrate, the substrate including a cell region and a peripheral circuit region, a lower interlayered insulating layer covering the cell region and the peripheral circuit region of the substrate, a plurality of magnetic tunnel junction patterns on the lower interlayered insulating layer and on the cell region, the plurality of magnetic tunnel junction patterns spaced apart from each other in a direction parallel to a top surface of the substrate, and a plurality of mask structures on separate, respective magnetic tunnel junction patterns of the plurality of magnetic tunnel junction patterns. Each mask structure of the plurality of mask structures may include a conductive pattern and a sacrificial pattern. Each sacrificial pattern of the plurality of mask structures may include a material having an etch selectivity with respect to the conductive pattern of the plurality of mask structures, respectively. The lower interlayered insulating layer on the cell region may have a recessed top surface between adjacent magnetic tunnel junction patterns of the plurality of magnetic tunnel junction patterns, the recessed top surface recessed toward the substrate, The lower interlayered insulating layer on the peripheral circuit region may have a top surface that is lower than the recessed top surface, when measured from the top surface of the substrate.

According to some example embodiments, a device may include a magnetic tunnel junction pattern on a substrate and a mask structure including a conductive pattern and a sacrificial pattern. The conductive pattern may be between the magnetic tunnel junction pattern and the sacrificial pattern. The sacrificial pattern may include a material having an etch selectivity with respect to the conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
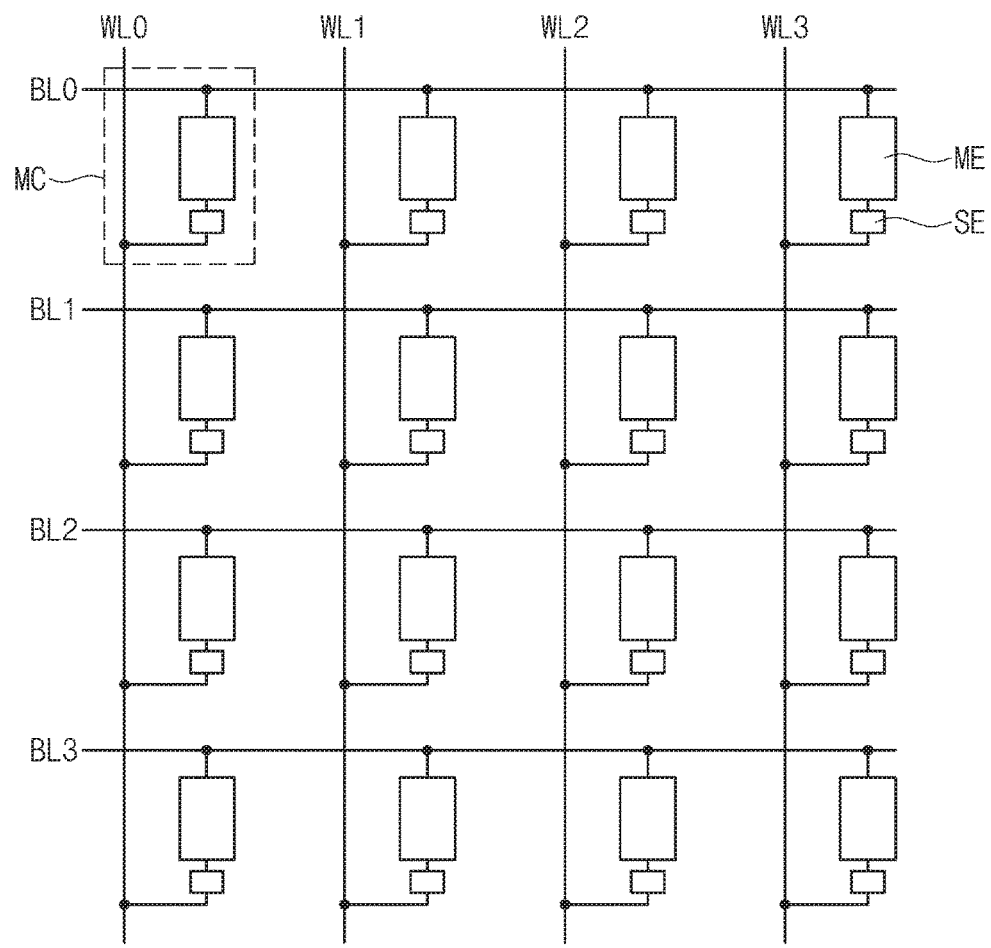
FIG. 1 is a circuit diagram of a memory cell array of a magnetic memory device according to some example embodiments of the inventive concepts.
Figure 2:
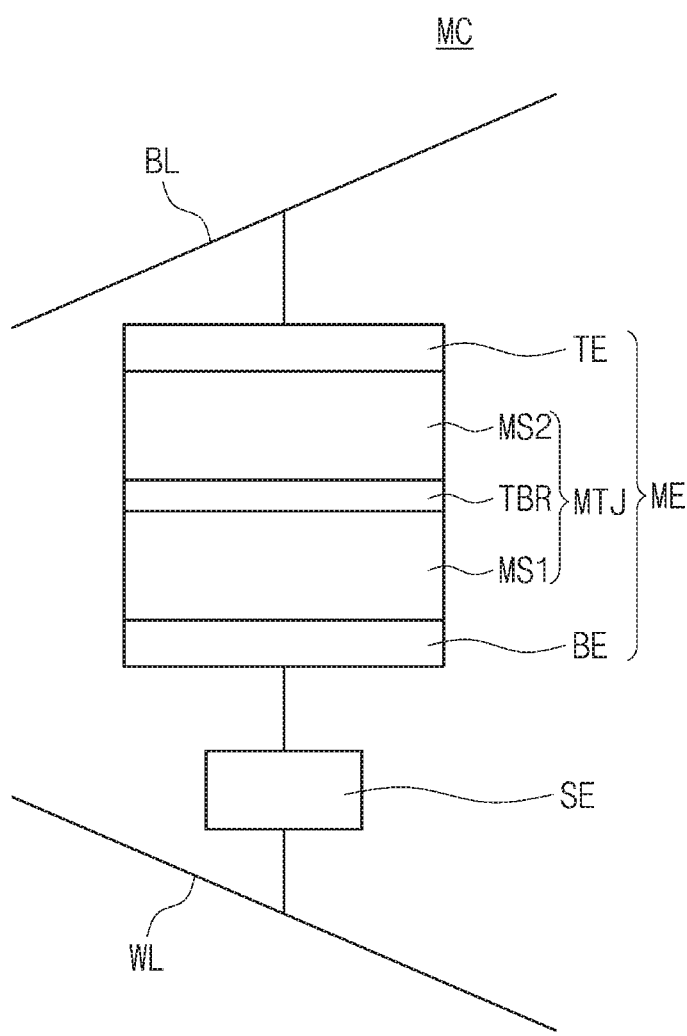
FIG. 2 is a circuit diagram of a unit memory cell of a magnetic memory device according to some example embodiments of the inventive concepts.

FIG. 1 is a circuit diagram of a memory cell array of a magnetic memory device according to some example embodiments of the inventive concepts, and FIG. 2 is a circuit diagram of a unit memory cell of a magnetic memory device according to some example embodiments of the inventive concepts.

Referring to FIG. 1, a memory cell array 10 may include a plurality of word lines WL0-WL3, a plurality of bit lines BL0-BL3, and a plurality of unit memory cells MC. The unit memory cells MC may be arranged two-dimensionally or three-dimensionally. The unit memory cells MC may be arranged between, and connected to, the word lines WL0-WL3 and the bit lines BL0-BL3, which are provided to cross each other. Each of the word lines WL0-WL3 may be connected to a plurality of the unit memory cells MC. The unit memory cells MC connected to each of the word lines WL0-WL3 may be connected to the bit lines BL0-BL3, respectively, and the unit memory cells MC connected to each of the bit lines BL0-BL3 may be connected to the word lines WL0-WL3, respectively. The unit memory cells MC, which are connected to each of the word lines WL0-WL3, may be connected to a read and write circuit through the bit lines BL0-BL3.

Referring to FIG. 2, each of the unit memory cells MC may include a memory element ME and a selection element SE. The memory element ME may be provided between, and connected to, the bit line BL and the selection element SE, and the selection element SE may be provided between, and connected to, the memory element ME and the word line WL. The memory element ME may be a variable resistance device, whose resistance can be switched to one of at least two states by an electric pulse applied thereto. In some example embodiments, the memory element ME may have a layered structure, whose electric resistance can by changed by a spin transfer process using an electric current passing therethrough. For example, the memory element ME may have a layered structure, which is configured to exhibit a magneto-resistance property, and may include at least one ferromagnetic material and/or at least one antiferromagnetic material. The selection element SE may be configured to selectively control a current flow of an electric current passing through the memory element ME. As an example, the selection element SE may be one of a diode, a pnp bipolar transistor, an npn bipolar transistor, an NMOS field effect transistor, and a PMOS field effect transistor. In the case where the selection element SE is a three-terminal device (e.g., a bipolar transistor or a MOS field effect transistor), an additional interconnection line (not shown) may be connected to the selection element SE.

The memory element ME may include a first magnetic structure MS1, a second magnetic structure MS2, and a tunnel barrier pattern TBR therebetween. The first magnetic structure MS1, the second magnetic structure MS2, and the tunnel barrier pattern TBR may constitute a magnetic tunnel junction MTJ. Each of the first and second magnetic structures MS1 and MS2 may include at least one magnetic layer made of a magnetic material. The memory element ME may include a bottom electrode BE, which is interposed between the first magnetic structure MS1 and the selection element SE, and a top electrode TE, which is interposed between the second magnetic structure MS2 and the bit line BL.

Figure 3:
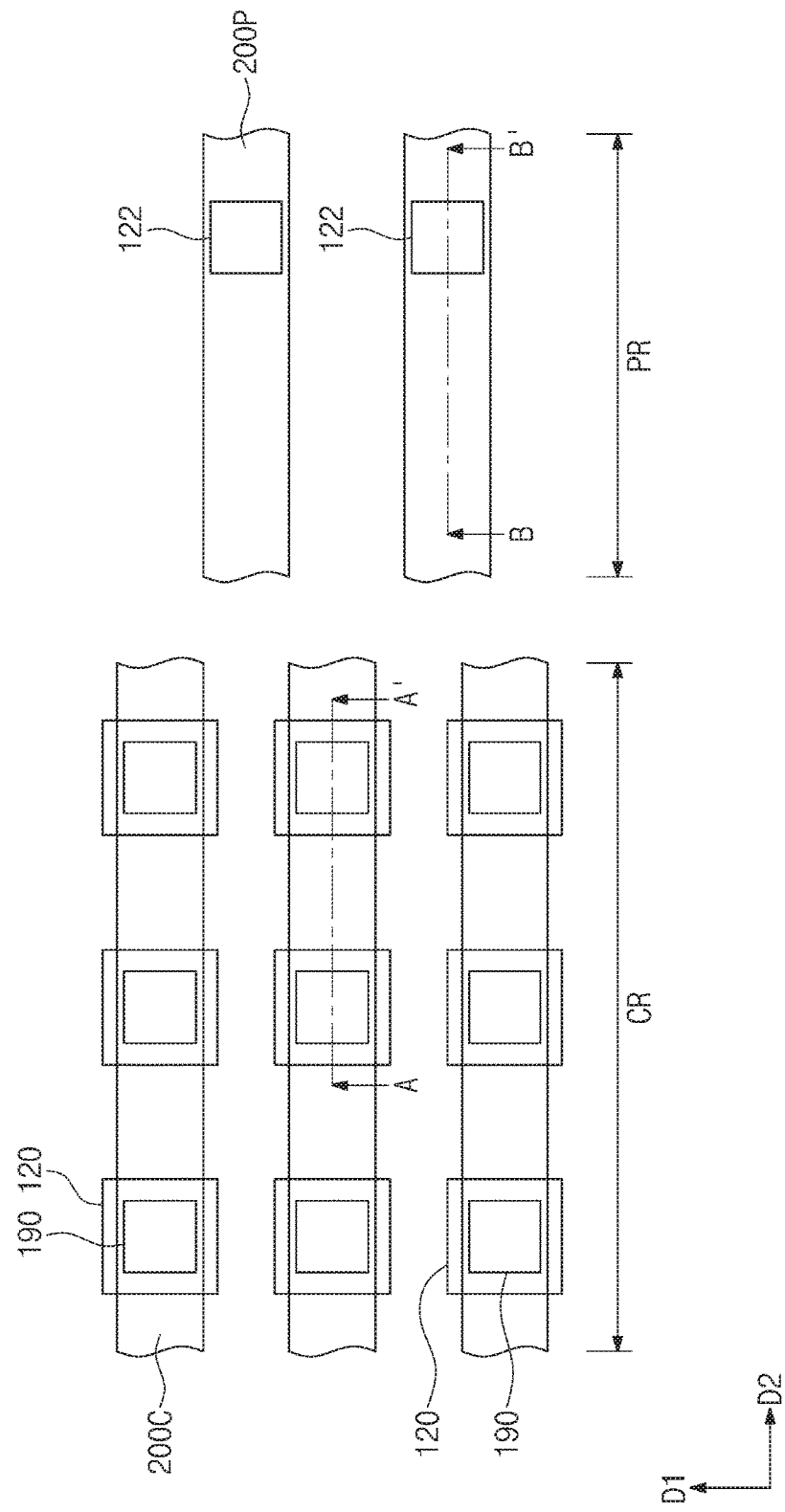
FIG. 3 is a plan view of a magnetic memory device according to some example embodiments of the inventive concepts.
Figure 4:
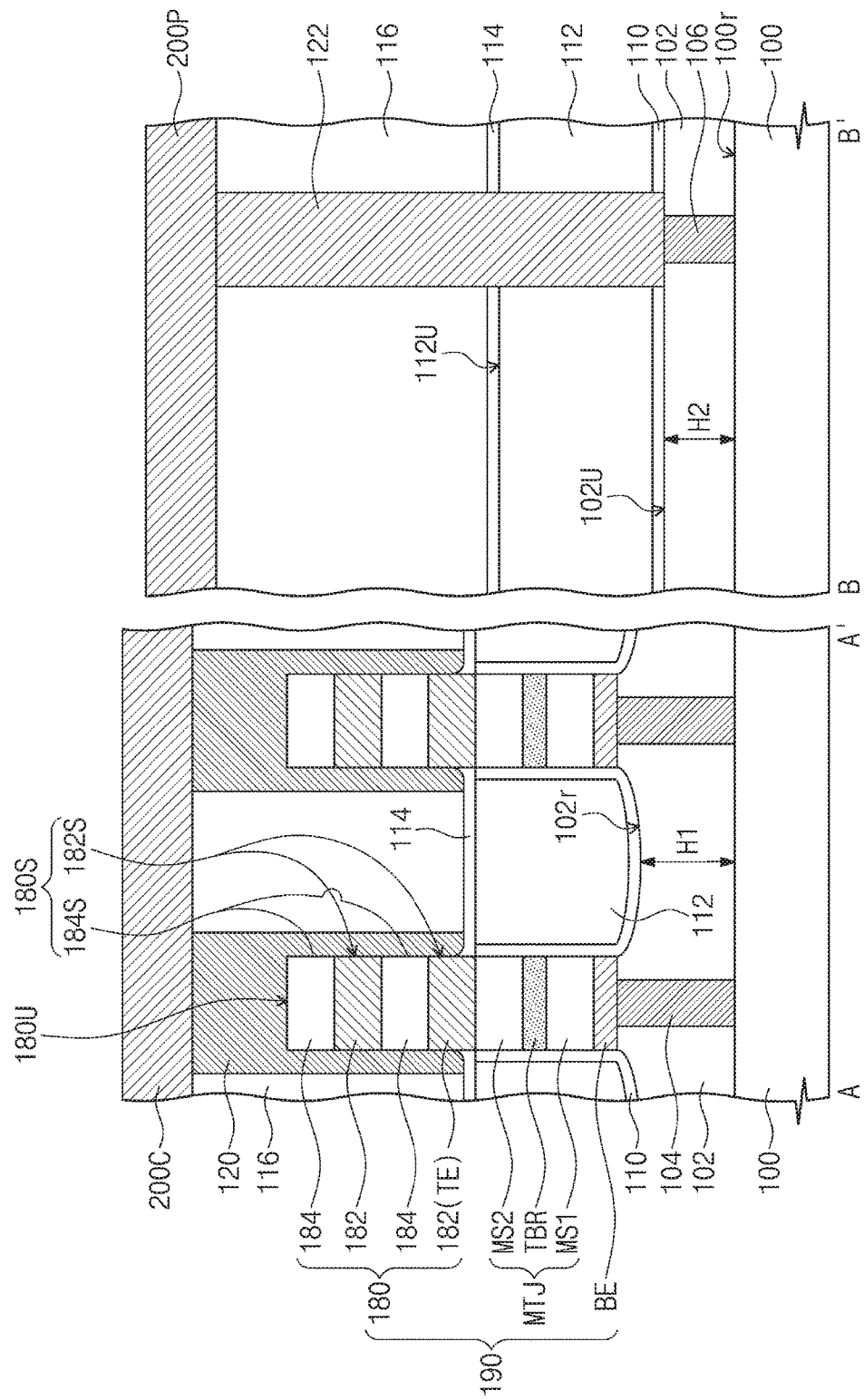
FIG. 4 is a sectional view taken along lines A-A' and B-B' of FIG. 3.

FIG. 3 is a plan view of a magnetic memory device according to some example embodiments of the inventive concepts, and FIG. 4 is a sectional view taken along lines A-A' and B-B' of FIG. 3.

Referring to FIGS. 3 and 4, a substrate 100 including a cell region CR and a peripheral circuit region PR may be provided. The cell region CR may be a part of the substrate 100, on which memory cells are provided, and the peripheral circuit region PR may be another part of the substrate 100, on which peripheral circuits are provided. The substrate 100 may be a semiconductor substrate, such as silicon, silicon-on-insulator (SOI), silicon germanium (SiGe), germanium (Ge), and gallium arsenide (GaAs) wafers. A lower interlayered insulating layer 102 may be provided on the substrate 100. The lower interlayered insulating layer 102 may be provided to cover the cell region CR and the peripheral circuit region PR of the substrate 100. The lower interlayered insulating layer 102 may also cover selection elements (not shown) provided on the substrate 100. The selection elements may be field effect transistors or diodes. The lower interlayered insulating layer 102 may be formed of or include oxide, nitride, and/or oxynitride.

It will be understood that when an element, including a layer, film, region, or substrate is referred to as being "on" another element, it can be directly on the other element or intervening elements may also be present. In contrast, when an element is referred to as being "directly on" another element, there are no intervening elements present.

Lower contact plugs 104 may be provided on the cell region CR of the substrate 100 to penetrate the lower interlayered insulating layer 102. Each of the lower contact plugs 104 may be provided to penetrate the lower interlayered insulating layer 102 and may be electrically coupled to a terminal of a corresponding one of the selection elements. As shown in at least FIG. 4, the lower contact plugs 104 may be connected to separate, respective magnetic tunnel junction patterns MTJ. The lower contact plugs 104 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), and metal-semiconductor compounds (e.g., metal silicide). A via contact 106 may be provided on ("may be on") the peripheral circuit region PR of the substrate 100 to penetrate the lower interlayered insulating layer 102. The via contact 106 may be provided to penetrate the lower interlayered insulating layer 102 and may be electrically coupled to the substrate 100. The via contact 106 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), and metal-semiconductor compounds (e.g., metal silicide).

As described herein, an element that may be "provided on" another element will be understood to be "on" the other element.

Data storing structures 190 may be provided on the cell region CR of the substrate 100. When viewed in a plan view, the data storing structures 190 may be two-dimensionally arranged (e.g., in first and second directions D1 and D2 crossing each other). The data storing structures 190 may be provided on the lower interlayered insulating layer 102, which is located on the cell region CR, and may be coupled to the lower contact plugs 104, respectively. Each of the data storing structures 190 may include a magnetic tunnel junction pattern MTJ, a bottom electrode BE, which is provided between each of the lower contact plugs 104 and the magnetic tunnel junction pattern MTJ, and a mask structure 180, which is spaced apart from the bottom electrode BE with the magnetic tunnel junction pattern MTJ interposed therebetween. Restated, a plurality of mask structures 180 may be on separate, respective magnetic tunnel junction patterns MTJ. For example, the magnetic tunnel junction pattern MTJ may be provided between the bottom electrode BE and the mask structure 180. The bottom electrode BE may be provided to be in direct contact with a corresponding one of the lower contact plugs 104. The bottom electrode BE may be formed of or include at least one of conductive metal nitrides (e.g., titanium nitride or tantalum nitride).

The magnetic tunnel junction pattern MTJ may include a first magnetic structure MS1, a second magnetic structure MS2, and a tunnel barrier pattern TBR therebetween. The first magnetic structure MS1 may be provided between the bottom electrode BE and the tunnel barrier pattern TBR, and the second magnetic structure MS2 may be provided between the mask structure 180 and the tunnel barrier pattern TBR. Each of the first magnetic structure MS1 and the second magnetic structure MS2 may include at least one magnetic layer. The tunnel barrier pattern TBR may be formed of or include at least one of magnesium oxide, titanium oxide, aluminum oxide, magnesium-zinc oxide, and magnesium-boron oxide.

Figure 22A:
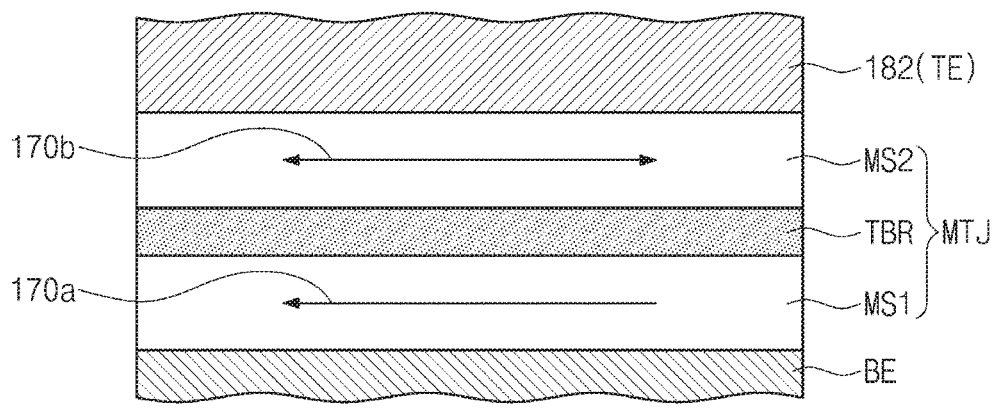
FIG. 22A is a sectional view illustrating an example of a magnetic tunnel junction pattern according to some example embodiments of the inventive concepts.

Hereinafter, the magnetic tunnel junction pattern MTJ will be described in more detail with reference to FIGS. 22A and 22B. FIG. 22A is a sectional view illustrating an example of a magnetic tunnel junction pattern according to some example embodiments of the inventive concepts, and FIG. 22B is a sectional view illustrating another example of a magnetic tunnel junction pattern according to some example embodiments of the inventive concepts.

Referring to FIG. 22A, the first magnetic structure MS1 may include a reference layer, whose magnetization direction 170a is fixed, and the second magnetic structure MS2 may include a free layer, whose magnetization direction 170b can be changed to be parallel or antiparallel to the magnetization direction 170a of the reference layer. The magnetization directions 170a and 170b of the reference and free layers may be substantially parallel to an interface between the tunnel barrier pattern TBR and the first magnetic structure MS1. Although FIG. 22A illustrates an example in which the first and second magnetic structures MS1 and MS2 include the reference and free layers, respectively, but the inventive concepts is not limited thereto. For example, unlike that shown in FIG. 22A, the first magnetic structure MS1 may be configured to include the free layer, and the second magnetic structure MS2 may be configured to include the reference layer. In the case where the magnetization directions 170a and 170b of the reference and free layers are substantially parallel to the interface between the tunnel barrier pattern TBR and the first magnetic structure MS1, each of the reference and free layers may include a ferromagnetic material. The reference layer may further include an anti-ferromagnetic material for fixing a magnetization direction of the ferromagnetic material.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

Figure 22B:
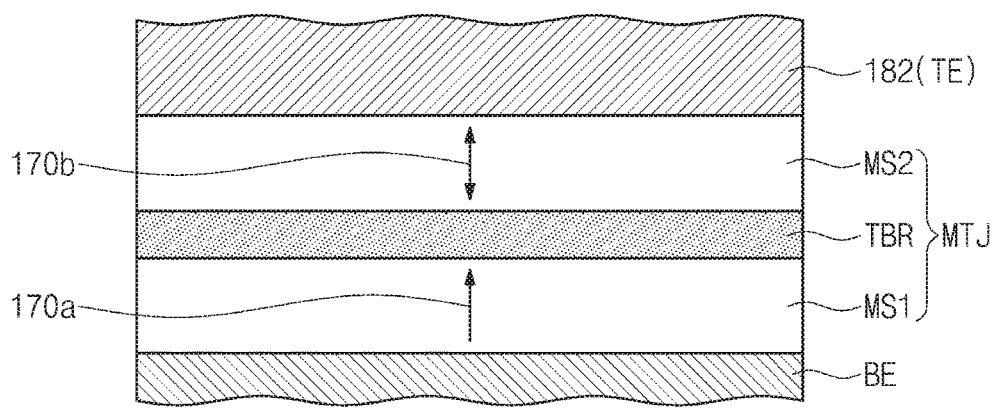
FIG. 22B is a sectional view illustrating another example of a magnetic tunnel junction pattern according to some example embodiments of the inventive concepts.

Referring to FIG. 22B, the first magnetic structure MS1 may include a reference layer, whose magnetization direction 170a is fixed, and the second magnetic structure MS2 may include a free layer, whose magnetization direction 170b can be changed to be parallel or antiparallel to the magnetization direction 170a of the reference layer. The magnetization directions 170a and 170b of the reference and free layers may be substantially perpendicular to the interface between the tunnel barrier pattern TBR and the first magnetic structure MS1. Although FIG. 22B illustrates an example in which the first and second magnetic structures MS1 and MS2 include the reference and free layers, respectively, but the inventive concepts are not limited thereto. For example, unlike that shown in FIG. 22B, the first magnetic structure MS1 may be configured to include the free layer, and the second magnetic structure MS2 may be configured to include the reference layer. In the case where the magnetization directions 170a and 170b are substantially perpendicular to the interface between the tunnel barrier pattern TBR and the first magnetic structure MS1, each of the reference and free layers may include at least one of perpendicular magnetic materials (e.g., CoFeTb, CoFeGd, and CoFeDy), perpendicular magnetic materials with $L1_0$ structure, CoPt-based materials with hexagonal-close-packed structure, and perpendicular magnetic structures. The perpendicular magnetic material with the $L1_0$ may include at least one of $L1_0$ FePt, $L1_0$ FePd, $L1_0$ CoPd, and $L1_0$ CoPt. The perpendicular magnetic structures may include magnetic layers and non-magnetic layers that are alternatingly and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where "n" is the number ("quantity") of stacked pairs of the layers. Here, the reference layer may be thicker than the free layer or may be configured to have a coercive force greater than that of the free layer.

Referring back to FIGS. 3 and 4, the mask structure 180 may include at least one conductive pattern 182 and at least one sacrificial pattern 184, which are stacked (e.g., sequentially stacked) on the magnetic tunnel junction pattern MTJ. The conductive pattern 182 may be formed of or include at least one material of metals (e.g., Ta, W, Ru, and/or Jr) and conductive metal nitrides (e.g., TiN). The conductive pattern 182 may be provided between the magnetic tunnel junction pattern MTJ and the sacrificial pattern 184, and the sacrificial pattern 184 may be spaced apart from the magnetic tunnel junction pattern MTJ with the conductive pattern 182 interposed therebetween. The conductive pattern 182 may be in contact with the magnetic tunnel junction pattern MTJ. For example, the conductive pattern 182 may be in contact with the second magnetic structure MS2 of the magnetic tunnel junction pattern MTJ. In some example embodiments, the mask structure 180 may include a plurality of the conductive patterns 182 and a plurality of the sacrificial patterns 184, and in this case, the plurality of conductive patterns 182 and the plurality of sacrificial patterns 184 may be alternately and repeatedly stacked on the magnetic tunnel junction pattern MTJ. Restated, the mask structure 180 may include an "alternating stack of patterns," where the alternating stack includes a plurality of conductive patterns 182 and a plurality of sacrificial patterns 184, as shown in at least FIGS. 3-4. The lowermost conductive pattern of the plurality of conductive patterns 182 may be in contact with a magnetic tunnel junction pattern MTJ (e.g., "one magnetic tunnel junction pattern"), and the lowermost sacrificial pattern of the plurality of sacrificial patterns 184 may be spaced apart from the magnetic tunnel junction pattern MTJ with the lowermost conductive pattern 182 interposed therebetween. The lowermost conductive pattern 182 may be in contact with the second magnetic structure MS2 of the magnetic tunnel junction pattern MTJ.

The conductive pattern 182 may be formed of or include at least one material of metals (e.g., Ta, W, Ru, and/or Jr) and conductive metal nitrides (e.g., TiN). The sacrificial pattern 184 may include a material having an etch selectivity with respect to the conductive pattern 182. The sacrificial pattern 184 may be formed of or include at least one material of silicon oxide, silicon nitride, silicon oxynitride, and metal oxides (e.g., titanium oxide, tungsten oxide, tantalum oxide, aluminum oxide, ruthenium oxide, and/or iridium oxide). In the case where the sacrificial pattern 184 includes a metal oxide, the sacrificial pattern 184 may include the same metallic element as that in the conductive pattern 182. Restated, the sacrificial pattern 184 and the conductive pattern 182 may include a common metallic element. In the case where the plurality of the sacrificial patterns 184 of the mask structure 180 include a metal oxide, each of the plurality of the sacrificial patterns 184 may include the same metallic element as that in the conductive pattern 182 immediately thereunder, of the plurality of the conductive patterns 182.

The lower interlayered insulating layer 102 on the cell region CR may have a top surface 102r, which is formed between the data storing structures 190 and is recessed toward the substrate 100. When measured from a top surface 100r of the substrate 100, the lowermost point of the recessed top surface 102r may be positioned at a first height H1. A top surface 102U of the lower interlayered insulating layer 102 on the peripheral circuit region PR may be positioned at a second height H2, which is less than the first height H1, from the top surface 100r of the substrate 100. A difference between the first and second heights H1 and H2 may be greater than about 0 Å and may be smaller than or equal to about 400 Å (i.e., 0 Å<H1−H2≤400 Å).

A first interlayered insulating layer 112 may be provided on the lower interlayered insulating layer 102. The first interlayered insulating layer 112 may be provided to cover the cell region CR and the peripheral circuit region PR of the substrate 100. Each of the data storing structures 190 (e.g., the MTJ and/or the mask structure 180) may be provided to penetrate (e.g., at least partially extend through) the first interlayered insulating layer 112 and may be connected to a corresponding one of the lower contact plugs 104. Each of the data storing structures 190 may be provided in such a way that the magnetic tunnel junction pattern MTJ and the bottom electrode BE are located in the first interlayered insulating layer 112 (e.g., at least partially extend through the first interlayered insulating layer 112). The first interlayered insulating layer 112 may be provided to expose the mask structure 180 of each of the data storing structures 190. In each of the data storing structures 190, a first protection layer 110 may be interposed between the magnetic tunnel junction pattern MTJ and the first interlayered insulating layer 112. The first protection layer 110 may be extended between the bottom electrode BE and the first interlayered insulating layer 112 and between the lower interlayered insulating layer 102 and the first interlayered insulating layer 112. The first protection layer 110 between the data storing structures 190 may cover the recessed top surface 102r of the lower interlayered insulating layer 102. On the peripheral circuit region PR, the first protection layer 110 may be extended along the top surface 102U of the lower interlayered insulating layer 102 and may be interposed between the lower interlayered insulating layer 102 and the first interlayered insulating layer 112. The first interlayered insulating layer 112 may be formed of or include at least one of oxide, nitride, and/or oxynitride, and the first protection layer 110 may include a nitride layer (e.g., a silicon nitride layer).

A second interlayered insulating layer 116 may be provided on the first interlayered insulating layer 112. The second interlayered insulating layer 116 may cover the cell region CR and the peripheral circuit region PR of the substrate 100. The mask structure 180 of each of the data storing structures 190 may be provided in the second interlayered insulating layer 116. For example, the mask structure 180 may extend at least partially through the second interlayered insulating layer 116. A second protection layer 114 may be extended along a top surface 112U of the first interlayered insulating layer 112 between the data storing structures 190, and may be interposed between the first interlayered insulating layer 112 and the second interlayered insulating layer 116. The second protection layer 114 may be in contact with a side surface 182S of the conductive pattern 182 of the mask structure 180. In the case where the mask structure 180 includes the plurality of the conductive patterns 182, the second protection layer 114 may be in contact with a side surface 182S of the lowermost one of the conductive patterns 182. On the peripheral circuit region PR, the second protection layer 114 may be extended along the top surface 112U of the first interlayered insulating layer 112 and may be interposed between the first interlayered insulating layer 112 and the second interlayered insulating layer 116. The second interlayered insulating layer 116 may be formed of or include oxide, nitride, and/or oxynitride. The second protection layer 114 may include an insulating material having an etch selectivity with respect to the second interlayered insulating layer 116. For example, in the case where the second interlayered insulating layer 116 includes silicon oxide, the second protection layer 114 may be formed of or include silicon nitride.

An upper contact plug 120 may be provided to penetrate at least a portion of the second interlayered insulating layer 116 and may be connected to the mask structure 180. In some example embodiments, the upper contact plug 120 may have a structure, in which the mask structure 180 is inserted. Restated, the upper contact plug 120 may at least partially encompass the mask structure 180. The upper contact plug 120 may be provided to cover not only a top surface 180U of the mask structure 180 but also a side surface 180S of the mask structure 180 (the side surface 180S including the side surface 182S of the one or more conductive patterns 182 of the mask structure 180 and the side surface 184S of the one or more sacrificial patterns 184 of the mask structure). Restated, the upper contact plug 120 may at least partially extend along the side surface 180S of the mask structure 180 to be in contact with the side surface 182S of the conductive pattern 182. When viewed in a plan view, the upper contact plug 120 may be provided to surround (e.g., may be configured to at least partially surround) the side surface 180S of the mask structure 180. The upper contact plug 120 may be extended (e.g., may at least partially extend) along the side surface 180S of the mask structure 180 to be in contact with the side surface 182S of the conductive pattern 182. In the case where the mask structure 180 includes the plurality of the conductive patterns 182, the upper contact plug 120 may be in contact with the side surface 182S of the lowermost one of the conductive patterns 182. The upper contact plug 120 may be electrically coupled to the magnetic tunnel junction pattern MTJ via ("through") the conductive pattern 182 (or the lowermost conductive pattern 182). In other words, the conductive pattern 182 (or the lowermost conductive pattern 182) may serve as a top electrode TE. The upper contact plug 120 may be spaced apart from the first protection layer 110 and the first interlayered insulating layer 112 by the second protection layer 114. In other words, the second protection layer 114 may be extended between the upper contact plug 120 and the first interlayered insulating layer 112 and between the upper contact plug 120 and the first protection layer 110 to be in contact with the side surface 182S of the conductive pattern 182 (or the lowermost conductive pattern 182). The second protection layer 114 may include a portion that is extended between the side surface 182S of the conductive pattern 182 (or the lowermost conductive pattern 182) and the upper contact plug 120. In some example embodiments, a plurality of the upper contact plugs 120 may be provided on the data storing structures 190, respectively. Each of the upper contact plugs 120 may be connected to the mask structure 180 of a corresponding one of the data storing structures 190. The upper contact plug 120 may be formed of or include at least one material of metallic materials (e.g., copper) and conductive metal nitrides.

A cell interconnection line 200C may be provided on the second interlayered insulating layer 116, which is located on the cell region CR. In some example embodiments, a plurality of the cell interconnection lines 200C may extend in the second direction D2 and may be arranged in the first direction D1, when viewed in a plan view. Each of the cell interconnection lines 200C may be connected to the upper contact plugs 120, which are arranged in the second direction D2, and thus, it may be electrically coupled to the data storing structures 190 arranged in the second direction D2.

Each of the data storing structures 190 may be electrically coupled to a corresponding one of the cell interconnection lines 200C via a corresponding one of the upper contact plugs 120. The cell interconnection line 200C may serve as a bit line. A peripheral interconnection line 200P may be provided on the second interlayered insulating layer 116, which is located on the peripheral circuit region PR. The peripheral interconnection line 200P may extend in the second direction D2, when viewed in a plan view, but the extension direction of the peripheral interconnection line 200P is not limited thereto. A peripheral contact plug 122 may be provided between the peripheral interconnection line 200P and the substrate 100. The peripheral contact plug 122 may be in contact with the peripheral interconnection line 200P. The peripheral contact plug 122 may be provided to penetrate the second interlayered insulating layer 116, the second protection layer 114, the first interlayered insulating layer 112, and the first protection layer 110 and may be connected to the via contact 106. The peripheral contact plug 122 may be electrically coupled to the substrate 100 via the via contact 106. The peripheral contact plug 122 may be electrically couple the peripheral interconnection line 200P to the via contact 106. Each of the cell interconnection line 200C, the peripheral interconnection line 200P, and the peripheral contact plug 122 may include at least one material of metals (e.g., copper) and conductive metal nitrides.

In general, a metal mask pattern, which is provided on the magnetic tunnel junction pattern MTJ and is used as a top electrode, may have a single layered structure. Such a single-layered metal mask pattern may be used as an etch mask in an etching process to be performed for the purpose of forming the magnetic tunnel junction pattern MTJ. In this case, conductive etch residues may be produced from the single-layered metal mask pattern and then may be re-deposited on a side surface of the magnetic tunnel junction pattern MTJ. Due to the re-deposited conductive etch residues, short circuits may be formed between magnetic layers of the magnetic tunnel junction pattern MTJ. An additional etching process may be further performed to remove the re-deposited conductive etch residues, but this may lead to an increase in height difference between two portions of the lower interlayered insulating layer 102, which are respectively located on the cell region CR and on the peripheral circuit region PR. As a result, the peripheral contact plug 122 may be formed to have an increased aspect ratio, and thus, a process of forming the peripheral contact plug 122 may become difficult.

By contrast, according to some example embodiments of the inventive concepts, each of the data storing structures 190 may include the magnetic tunnel junction pattern MTJ and the mask structure 180 on the magnetic tunnel junction pattern MTJ. The mask structure 180 may include at least one conductive pattern 182 and at least one sacrificial pattern 184, which are stacked on the magnetic tunnel junction pattern MTJ. The sacrificial pattern 184 may be formed of or include at least one material of silicon oxide, silicon nitride, silicon oxynitride, and metal oxide. The mask structure 180 may be used as an etch mask in an etching process for the forming the magnetic tunnel junction pattern MTJ. Since the mask structure 180 has a multi-layered structure including the conductive pattern 182 and the sacrificial pattern 184, it may be possible to reduce an amount of conductive etch residues produced from the mask structure 180 during the etching process. Accordingly, it may be possible to reduce an amount of the conductive etch residues to be re-deposited on the side surface of the magnetic tunnel junction pattern MTJ and consequently to suppress or mitigate and/or prevent occurrence of short circuits in the magnetic tunnel junction pattern MTJ.

In addition, even when an additional etching process is performed to remove the re-deposited conductive etch residue, the reduction of the re-deposition amount of the conductive etch residues may allow to reduce an etching target amount for the additional etching process. Accordingly, it may be possible to mitigate and/or prevent an excessive etching of an upper portion of the lower interlayered insulating layer 102, which is located on the peripheral circuit region PR, during the additional etching process, and consequently to reduce a height difference between two portions of the lower interlayered insulating layer 102, which are respectively located on the cell region CR and the peripheral circuit region PR. As a result, the peripheral contact plug 122 may be formed to have a reduced aspect ratio, and thus, a process of forming the peripheral contact plug 122 may be performed with ease.

Accordingly, it may be possible to easily fabricate a magnetic memory device with improved electric characteristics.

FIG. 5, FIG. 6, FIG. 7, FIG. 8, FIG. 9, FIG. 10, FIG. 11, FIG. 12, FIG. 13, FIG. 14, and FIG. 15 are sectional views, which are provided to illustrate a method of fabricating a magnetic memory device according to some example embodiments of the inventive concepts, and each of which corresponds to be taken along lines A-A' and B-B' of FIG. 3.

Figure 5:
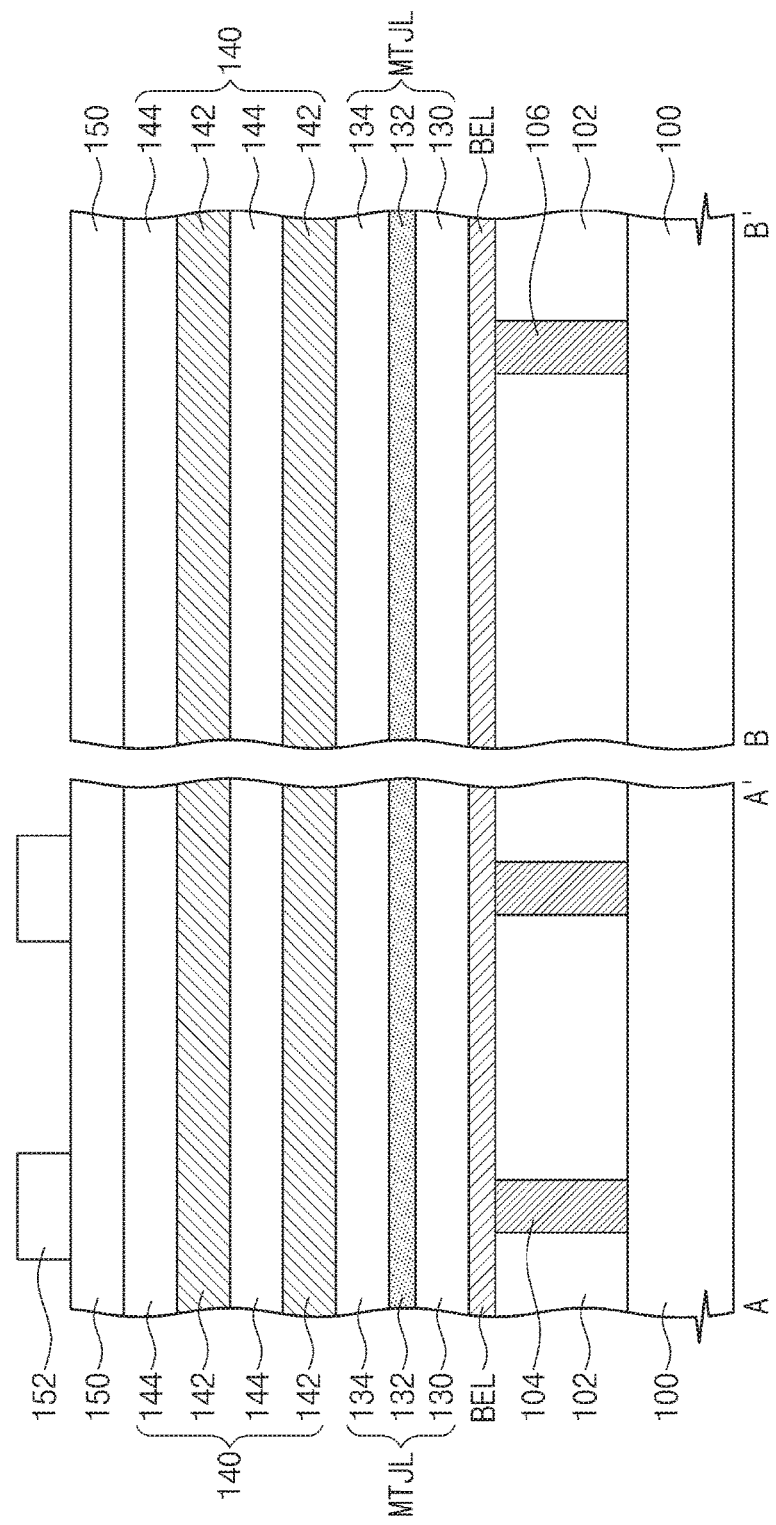
FIG. 5, FIG. 6, FIG. 7, FIG. 8, FIG. 9, FIG. 10, FIG. 11, FIG. 12, FIG. 13, FIG. 14, and FIG. 15 are sectional views, which are provided to illustrate a method of fabricating a magnetic memory device according to some example embodiments of the inventive concepts, and each of which is taken along lines A-A' and B-B' of FIG. 3.

Referring to FIG. 5, a lower interlayered insulating layer 102 may be formed on a substrate 100. The substrate 100 may be a semiconductor substrate, such as silicon, silicon-on-insulator (SOI), silicon germanium (SiGe), germanium (Ge), and gallium arsenide (GaAs) wafers. Selection elements (not shown) may be formed on the substrate 100. The selection elements may be field effect transistors or diodes. The lower interlayered insulating layer 102 may be formed to cover the selection elements. As shown in FIG. 3, the substrate 100 may include a cell region CR, on which memory cells are provided, and a peripheral circuit region PR, on which peripheral circuits are provided. The lower interlayered insulating layer 102 may be formed to cover the cell region CR and the peripheral circuit region PR. The lower interlayered insulating layer 102 may have a single- or multi-layered structure and may be formed of at least one of oxide, nitride, and oxynitride.

Lower contact plugs 104 may be formed on the cell region CR of the substrate 100 to penetrate the lower interlayered insulating layer 102. The formation of the lower contact plugs 104 may include forming lower contact holes to pass through the lower interlayered insulating layer 102 and forming the lower contact plugs 104 in the lower contact holes, respectively. Each of the lower contact plugs 104 may be electrically coupled to a terminal of a corresponding one of the selection elements. The lower contact plugs 104 may be formed of or include at least one material of doped semiconductor materials (e.g., doped silicon), metals (e.g., tungsten, titanium, and/or tantalum), conductive metal nitrides (e.g., titanium nitride, tantalum nitride, and/or tungsten nitride), and metal-semiconductor compounds (e.g., metal silicide). A via contact 106 may be formed on the peripheral circuit region PR of the substrate 100 to penetrate the lower interlayered insulating layer 102. The formation of the via contact 106 may include forming a via contact hole to pass through the lower interlayered insulating layer 102 and forming the via contact 106 in the via contact hole. The via contact 106 may be electrically coupled to the substrate 100 and may be formed of or include at least one material of doped semiconductor materials (e.g., doped silicon), metals (e.g., tungsten, titanium, and/or tantalum), conductive metal nitrides (e.g., titanium nitride, tantalum nitride, and/or tungsten nitride), and metal-semiconductor compounds (e.g., metal silicide). The lower contact plugs 104 and the via contact 106 may be formed at the same time using the same process. The lower contact plugs 104 and the via contact 106 may be formed to have top surfaces that are substantially coplanar with that of the lower interlayered insulating layer 102.

A bottom electrode layer BEL and a magnetic tunnel junction layer MTJL may be sequentially formed on the lower interlayered insulating layer 102. The bottom electrode layer BEL may be formed of or include at least one material of conductive metal nitrides (e.g., titanium nitride and/or tantalum nitride). The bottom electrode layer BEL may be formed by a sputtering process, a chemical vapor deposition process, and/or an atomic layer deposition process. The magnetic tunnel junction layer MTJL may include a first magnetic structure layer 130, a tunnel barrier layer 132, and a second magnetic structure layer 134, which are sequentially stacked on the bottom electrode layer BEL. Each of the first and second magnetic structure layers 130 and 134 may include at least one magnetic layer. One of the first and second magnetic structure layers 130 and 134 may include a reference layer having a fixed magnetization direction, and the other of the first and second magnetic structure layers 130 and 134 may include a free layer having a switchable magnetization direction. In some example embodiments, the magnetization directions of the reference and free layers may be substantially parallel to an interface between the tunnel barrier layer 132 and the first magnetic structure layer 130. In this case, each of the reference and free layers may include a ferromagnetic material, and the reference layer may further include an anti-ferromagnetic material for fixing a magnetization direction of the ferromagnetic material therein. In certain embodiments, the magnetization directions of the reference and free layers may be substantially perpendicular to the interface between the tunnel barrier layer 132 and the first magnetic structure layer 130. In this case, the reference and free layers may include at least one of perpendicular magnetic materials (e.g., CoFeTb, CoFeGd, and CoFeDy), perpendicular magnetic materials with $L1_0$ structure, CoPt-based materials with hexagonal-close-packed structure, and perpendicular magnetic structures. The perpendicular magnetic material with the $L1_0$ may include at least one of $L1_0$ FePt, $L1_0$ FePd, $L1_0$ CoPd, and $L1_0$ CoPt. The perpendicular magnetic structures may include magnetic layers and non-magnetic layers that are alternatingly and repeatedly stacked. Restated, the perpendicular magnetic structures may include an "alternating stack of patterns," where the alternating stack includes a plurality of magnetic layers and a plurality of non-magnetic layers. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers. Here, the reference layer may be thicker than the free layer or may be configured to have a coercive force greater than that of the free layer. The tunnel barrier layer 132 may be formed of or include at least one of magnesium oxide, titanium oxide, aluminum oxide, magnesium-zinc oxide, and magnesium-boron oxide. Each of the first magnetic structure layer 130, the tunnel barrier layer 132, and the second magnetic structure layer 134 may be formed by a physical vapor deposition process or a chemical vapor deposition process.

A mask layer 140 may be formed on the magnetic tunnel junction layer MTJL. The mask layer 140 may include at least one conductive layer 142 and at least one sacrificial layer 144, which are stacked on the magnetic tunnel junction layer MTJL. In the case where the mask layer 140 has one (or a single) conductive layer 142 and one (or a single) sacrificial layer 144, the conductive layer 142 may be formed between the magnetic tunnel junction layer MTJL and the sacrificial layer 144, and may be in contact with the magnetic tunnel junction layer MTJL. As an example, the conductive layer 142 may be formed between the second magnetic structure layer 134 and the sacrificial layer 144, and may be in contact with the second magnetic structure layer 134. In the case where the mask layer 140 has a plurality of conductive layers 142 and a plurality of sacrificial layers 144, the plurality of conductive layers 142 and the plurality of sacrificial layers 144 may be alternately and repeatedly stacked on the magnetic tunnel junction layer MTJL. The lowermost one of the plurality of conductive layers 142 may be in contact with the magnetic tunnel junction layer MTJL, and the lowermost one of the plurality of sacrificial layers 144 may be spaced apart from the magnetic tunnel junction layer MTJL with the lowermost conductive layer 142 interposed therebetween. The lowermost conductive layer 142 may be interposed between the magnetic tunnel junction layer MTJL and the lowermost sacrificial layer 144. As an example, the lowermost conductive layer 142 may be in contact with the second magnetic structure layer 134 and may be interposed between the second magnetic structure layer 134 and the lowermost sacrificial layer 144.

The conductive layer 142 may be formed of or include at least one material of metals (e.g., Ta, W, Ru, and/or Ir) and conductive metal nitrides (e.g., TiN). The sacrificial layer 144 may include a material having an etch selectivity with respect to the conductive layer 142. The sacrificial layer 144 may be formed of or include at least one material of silicon oxide, silicon nitride, silicon oxynitride, and metal oxides (e.g., titanium oxide, tungsten oxide, tantalum oxide, aluminum oxide, ruthenium oxide, and/or iridium oxide). The conductive layer 142 may be formed by a sputtering process, a physical vapor deposition process, and/or a chemical vapor deposition process. The sacrificial layer 144 may be deposited on the conductive layer 142 by using, for example, a sputtering process, a physical vapor deposition process, and/or a chemical vapor deposition process. In certain embodiments, the sacrificial layer 144 may be formed by performing an oxidation process on a portion of the conductive layer 142. In the case where the sacrificial layer 144 is formed by the oxidation process, the sacrificial layer 144 may contain the same metallic element as that in the conductive layer 142. In the case where the mask layer 140 include the plurality of conductive layers 142 and the plurality of sacrificial layers 144, each of the sacrificial layers 144 may be separately deposited on a corresponding one of the conductive layers 142, and/or may be formed by partially oxidizing a corresponding one of the conductive layers 142. In the case where each of the sacrificial layers 144 is formed by partially oxidizing a corresponding one of the conductive layers 142, each of the sacrificial layers 144 may contain the same metallic element as that in the corresponding conductive layer 142 immediately thereunder.

A preliminary mask layer 150 may be formed on the mask layer 140, and a photoresist pattern 152 may be formed on the preliminary mask layer 150. The preliminary mask layer 150 may be a carbon-containing layer (for example, a carbon-containing silicon layer). The photoresist pattern 152 may be formed on the cell region CR of the substrate 100 to define a position and shape of a data storing structure to be described below.

Figure 6:
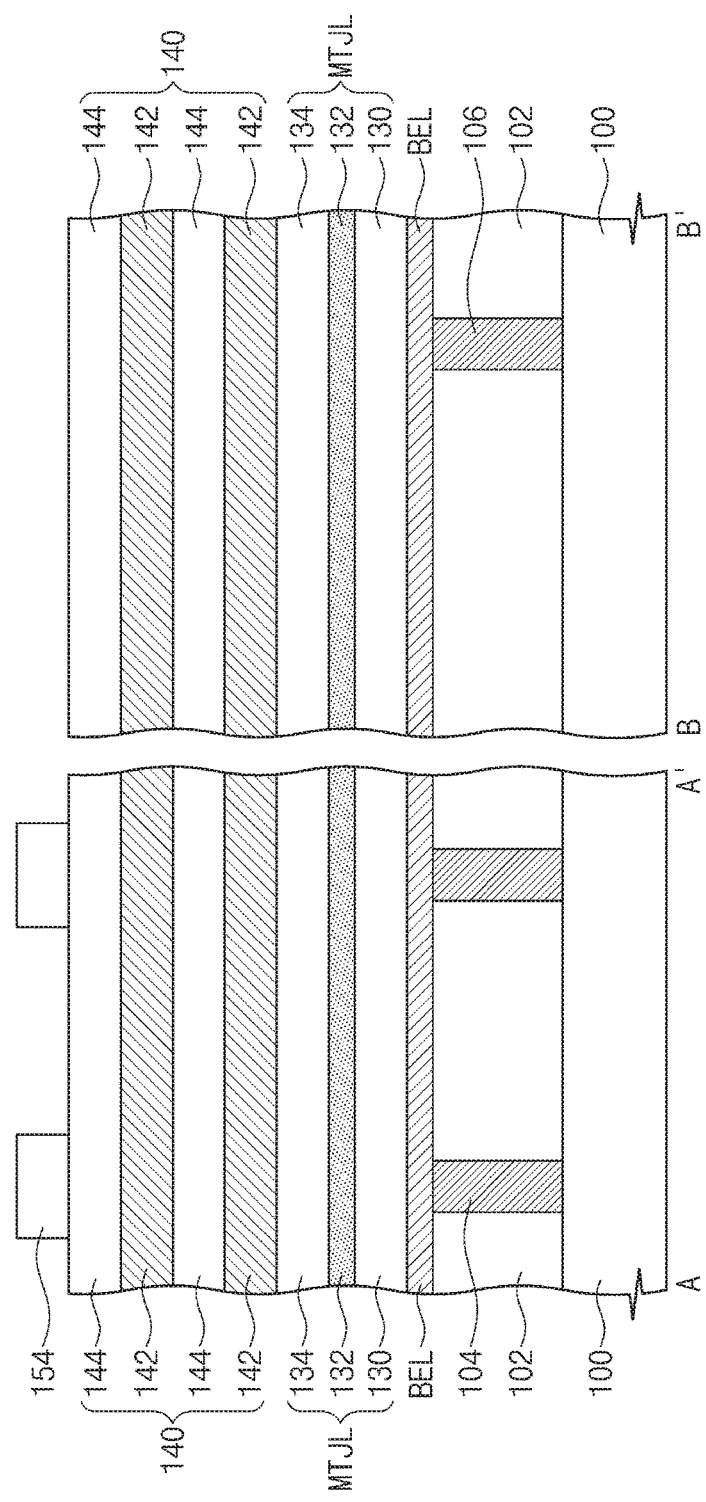

Referring to FIG. 6, preliminary mask patterns 154 may be formed by patterning the preliminary mask layer 150 using the photoresist pattern 152 as an etch mask. The preliminary mask patterns 154 may be formed on the cell region CR of the substrate 100. The preliminary mask patterns 154 may be formed to expose a top surface of the mask layer 140, which is located on the cell region CR. In addition, the preliminary mask pattern 154 may be formed to expose a top surface of the mask layer 140 of the peripheral circuit region PR. After the formation of the preliminary mask pattern 154, the photoresist pattern 152 may be removed.

Figure 7:
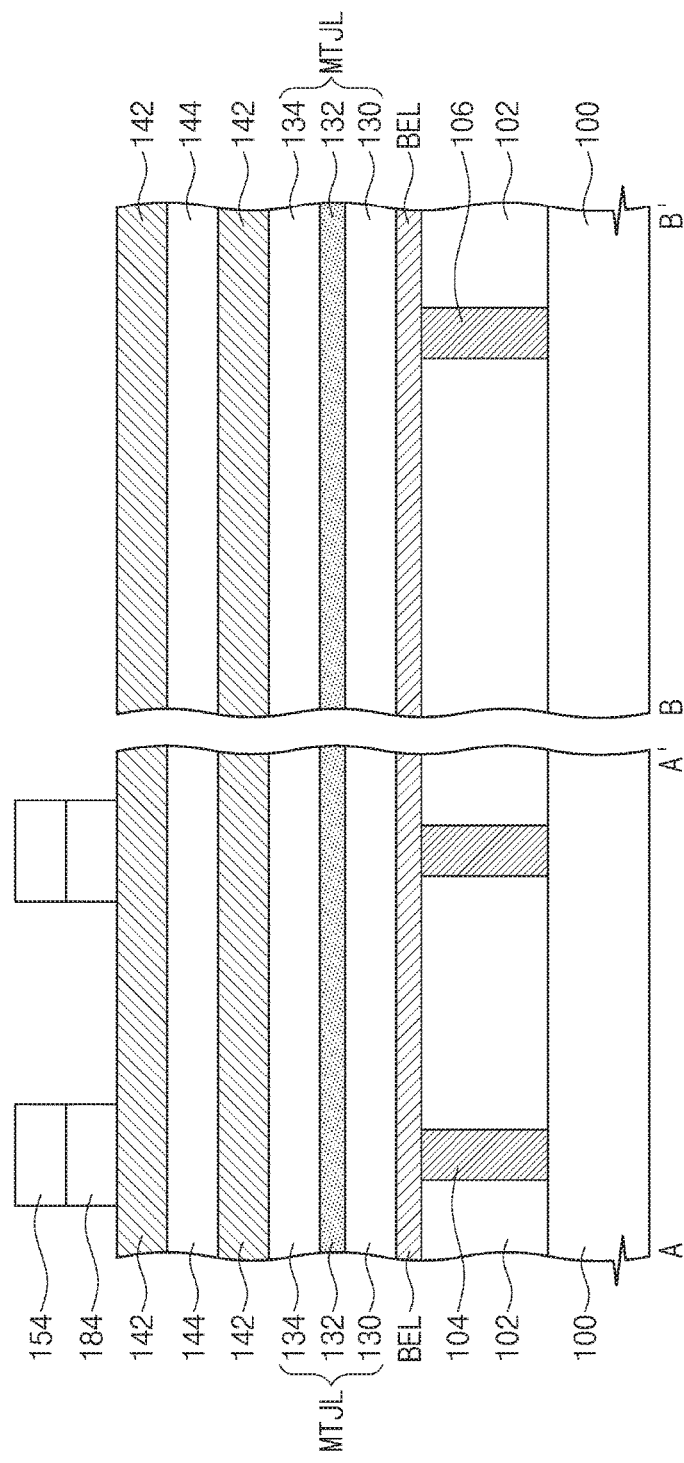

Referring to FIG. 7, the uppermost layer in the mask layer 140 may be patterned using the preliminary mask pattern 154 as an etch mask. In some embodiments, the uppermost layer in the mask layer 140 may be the sacrificial layer 144. In this case, sacrificial patterns 184 may be formed by patterning the uppermost sacrificial layer 144 using the preliminary mask pattern 154 as an etch mask. The sacrificial patterns 184 may be formed on the cell region CR of the substrate 100. The sacrificial patterns 184 may be formed to expose a top surface of the conductive layer 142, which is located on the cell region CR. The sacrificial patterns 184 may also be formed to expose a top surface of the conductive layer 142 located on the peripheral circuit region PR. In the case where the mask layer 140 includes the plurality of conductive layers 142 and the plurality of sacrificial layers 144, the uppermost layer in the mask layer 140 may be the uppermost layer of the sacrificial layers 144. In this case, uppermost sacrificial patterns 184 may be formed by patterning the uppermost sacrificial layer 144 using the preliminary mask pattern 154 as an etch mask. The uppermost sacrificial patterns 184 may be formed on the cell region CR of the substrate 100. The uppermost sacrificial patterns 184 may be formed to expose a top surface of the uppermost layer of the conductive layers 142. For example, adjacent ones of the uppermost sacrificial patterns 184 may be formed to expose the top surface of the uppermost conductive layer 142, which is located on the cell region CR. The uppermost sacrificial patterns 184 may also be formed to expose a top surface of the uppermost conductive layer 142, which is located on the peripheral circuit region PR.

Figure 8:
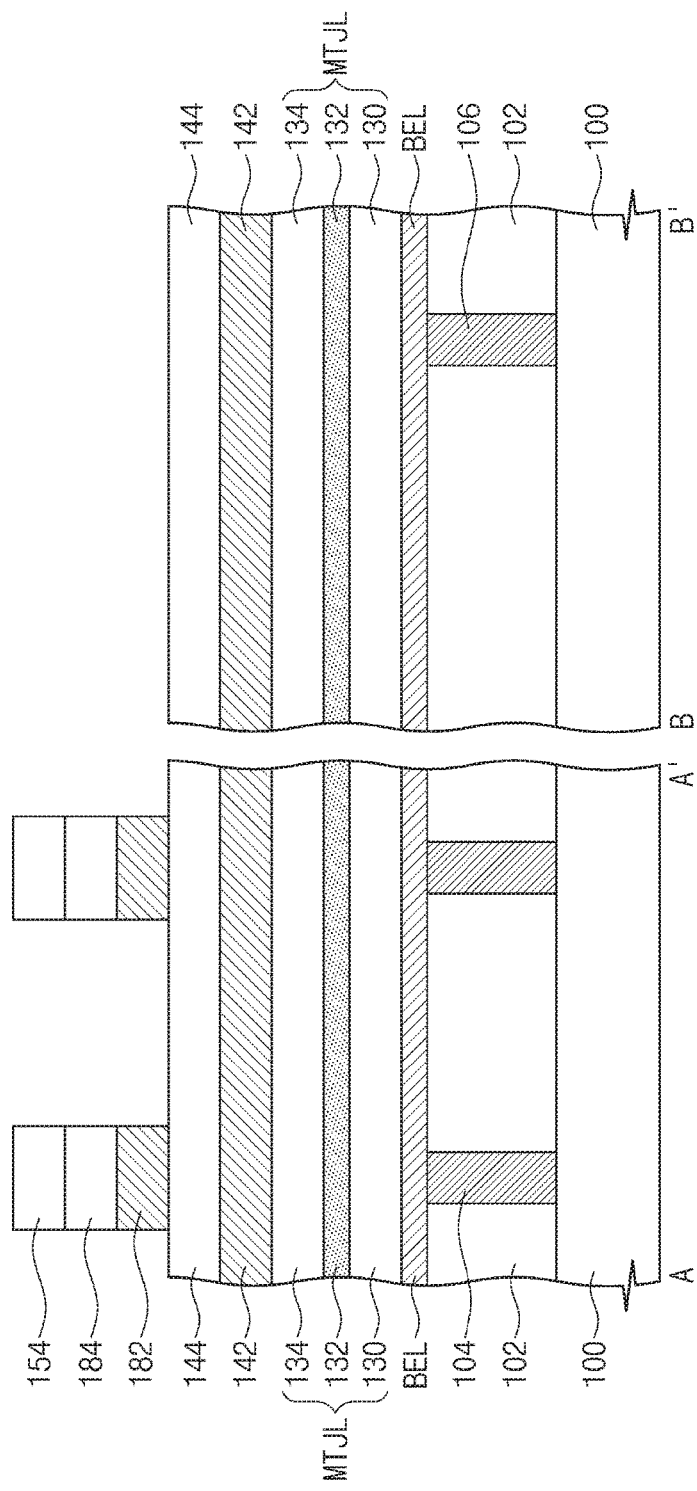
Figure 9:
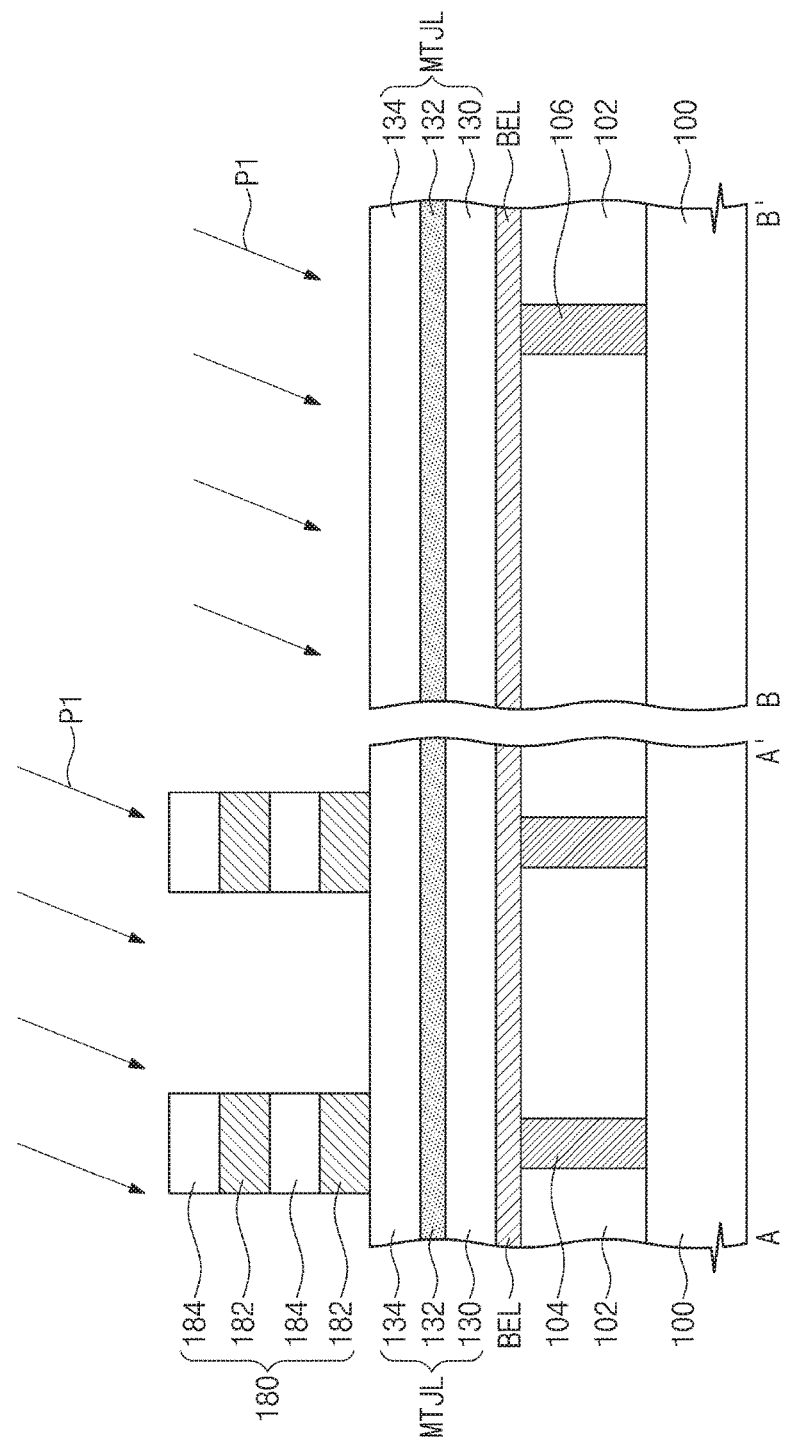

Referring to FIG. 8, conductive patterns 182 may be formed by patterning the conductive layer 142 using the sacrificial patterns 184 as an etch mask. The formation of the conductive patterns 182 may include etching the conductive layer 142 using an etch recipe having an etch selectivity with respect to the sacrificial patterns 184. For example, during the etching of the conductive layer 142, an etch rate of the sacrificial patterns 184 may be lower than that of the conductive layer 142. In the case where the mask layer 140 includes the plurality of conductive layers 142 and the plurality of sacrificial layers 144, uppermost conductive patterns 182 may be formed by patterning the uppermost layer of the conductive layers 142 using the uppermost sacrificial patterns 184 as an etch mask. The formation of the uppermost conductive patterns 182 may include etching the uppermost layer of the conductive layers 142 using an etch recipe having an etch selectivity with respect to the uppermost sacrificial patterns 184. The uppermost conductive patterns 182 may be provided to expose a top surface of the sacrificial layer 144 immediately thereunder. As shown in FIG. 9, the sacrificial layer 144 under the uppermost conductive patterns 182 may be patterned using the uppermost conductive patterns 182 as an etch mask to form additional sacrificial patterns 184, and the conductive layer 142 under the additional sacrificial patterns 184 may be patterned using the additional sacrificial patterns 184 as an etch mask to form additional conductive patterns 182.

Although FIGS. 7 and 8 illustrate an example in which the uppermost layer of the mask layer 140 is the sacrificial layer 144 or the uppermost sacrificial layer 144, but the inventive concepts is not limited thereto. In the case where the mask layer 140 includes the plurality of conductive layers 142 and the plurality of sacrificial layers 144, the uppermost layer of the mask layer 140 may be the uppermost layer of the conductive layers 142, unlike that illustrated in the drawings. In this case, uppermost conductive patterns 182 may be formed by patterning the uppermost conductive layer 142 using the preliminary mask pattern 154 as an etch mask. Uppermost sacrificial patterns 184 may be formed by patterning the uppermost sacrificial layer 144 using the uppermost conductive patterns 182 as an etch mask. The formation of the uppermost sacrificial patterns 184 may include etching the uppermost sacrificial layer 144 using an etch recipe having an etch selectivity with respect to the uppermost conductive patterns 182. The uppermost sacrificial patterns 184 may be formed to expose a top surface of the conductive layer 142 immediately thereunder. Thereafter, the conductive layer 142 under the uppermost sacrificial patterns 184 may be patterned using the uppermost sacrificial patterns 184 as an etch mask to form additional conductive patterns 182.

Referring to FIG. 9, as a result of the patterning of the mask layer 140, a mask structure 180 may be formed on the magnetic tunnel junction layer MTJL. The mask structure 180 may include at least one conductive pattern 182 and at least one sacrificial pattern 184, which are stacked on the magnetic tunnel junction layer MTJL. In the case where the mask structure 180 has one (or a single) conductive pattern 182 and one (or a single) sacrificial pattern 184 stacked on the magnetic tunnel junction layer MTJL, the conductive pattern 182 may be interposed between the magnetic tunnel junction layer MTJL and the sacrificial pattern 184 and may be in contact with the magnetic tunnel junction layer MTJL. In the case where the mask structure 180 includes a plurality of conductive patterns 182 and a plurality of sacrificial patterns 184 stacked on the magnetic tunnel junction layer MTJL, the plurality of conductive patterns 182 and the plurality of sacrificial patterns 184 may be alternately and repeatedly stacked on the magnetic tunnel junction layer MTJL. The lowermost one of the plurality of conductive patterns 182 may be in contact with the magnetic tunnel junction pattern MTJ, and the lowermost one of the plurality of sacrificial patterns 184 may be spaced apart from the magnetic tunnel junction pattern MTJ with the lowermost conductive pattern 182 interposed therebetween.

The mask structures 180 may be formed on the cell region CR of the substrate 100. The mask structures 180 may be formed to expose a top surface of the magnetic tunnel junction layer MTJL located on the cell region CR. The mask structures 180 may also be formed to expose a top surface of the magnetic tunnel junction layer MTJL, which is located on the peripheral circuit region PR. A first etching process P1 may be performed on the substrate 100 provided with the mask structure 180. During the first etching process P1, the magnetic tunnel junction layer MTJL may be patterned using the mask structure 180 as an etch mask. The first etching process P1 may be a physical etching process to be performed using an ion beam.

Figure 10:
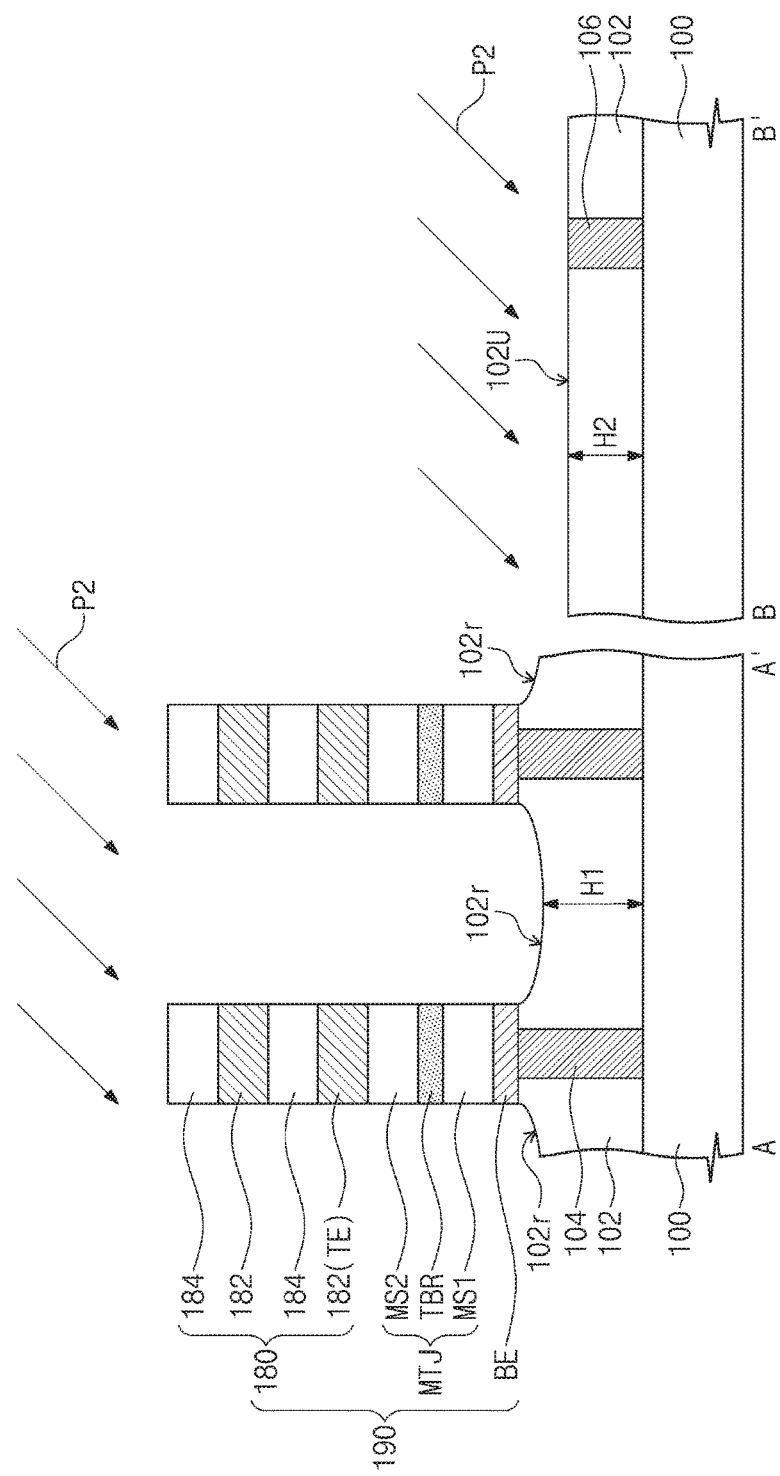

Referring to FIG. 10, a magnetic tunnel junction pattern MTJ may be formed by the first etching process P1. The formation of the magnetic tunnel junction pattern MTJ may include sequentially etching the second magnetic structure layer 134, the tunnel barrier layer 132, and the first magnetic structure layer 130 using the mask structure 180 as an etch mask. The magnetic tunnel junction pattern MTJ may include a first magnetic structure MS1, a second magnetic structure MS2, and a tunnel barrier pattern TBR therebetween. The second magnetic structure MS2, the tunnel barrier pattern TBR, and the first magnetic structure MS1 may be formed by patterning the second magnetic structure layer 134, the tunnel barrier layer 132, and the first magnetic structure layer 130. The first etching process P1 for patterning the bottom electrode layer BEL may be performed to form a bottom electrode BE. The formation of the bottom electrode BE may include etching the bottom electrode layer BEL using the mask structure 180 as an etch mask. The bottom electrode BE may be electrically coupled to a corresponding one of the lower contact plugs 104 formed in the lower interlayered insulating layer 102. The mask structure 180, the magnetic tunnel junction pattern MTJ, and the bottom electrode BE may constitute a data storing structure 190. The conductive pattern 182 (or the lowermost conductive pattern 182) of the mask structure 180, which is in contact with the magnetic tunnel junction pattern MTJ, may serve as a top electrode TE.

During the first etching process P1, conductive etch residues may be produced from the mask structure 180 and may be re-deposited on a side surface of the magnetic tunnel junction pattern MTJ. To remove the re-deposited conductive etch residue, a second etching process P2 may be performed on the substrate 100. The second etching process P2 may be a physical etching process using an ion beam. During the first and second etching processes P1 and P2, an upper portion of the lower interlayered insulating layer 102 between adjacent ones of the data storing structures 190 (e.g., between adjacent magnetic tunnel junction patterns MTJ) may be partially recessed. Accordingly, the lower interlayered insulating layer 102 on the cell region CR may have a recessed top surface 102r, which is recessed toward the substrate 100 and between adjacent ones of the data storing structures 190. In addition, during the first and second etching processes P1 and P2, upper portions of the lower interlayered insulating layer 102 and the via contact 106 on the peripheral circuit region PR may also be partially recessed. When measured from a top surface 100r of the substrate 100, the lowermost point of the recessed top surface 102r, which is most adjacent to the substrate 100, may be positioned at a first height H1. The top surface 102U of the lower interlayered insulating layer 102 on the peripheral circuit region PR may be positioned at a second height H2, when measured from the top surface 100r of the substrate 100. The second height H2 may be smaller than the first height H1. A difference between the first and second heights H1 and H2 may be greater than about 0 Å and may be smaller than or equal to about 400 Å (i.e., 0 Å<H1−H2≤400 Å). As a result of the first and second etching processes P1 and P2, a topmost surface of a via contact 106 may be at a level lower than a level of a topmost surface of each lower contact plug 104, when measured from the top surface 100r of the substrate 100.

According to some example embodiments of the inventive concepts, the mask structure 180 may be formed to have a multi-layered structure including the at least one conductive pattern 182 and the at least one sacrificial pattern 184, and the at least one sacrificial pattern 184 may be formed of or include at least one material of silicon oxide, silicon nitride, silicon oxynitride, and metal oxide. In this case, it may be possible to reduce an amount of the conductive etch residues to be produced from the mask structure 180, during the first etching process P1. Thus, it may be possible to reduce an amount of the conductive etch residue re-deposited on the side surface of the magnetic tunnel junction pattern MTJ and consequently to suppress a short circuit of the magnetic tunnel junction pattern MTJ.

Furthermore, in the case where an amount of the re-deposited conductive etch residue is reduced, it may be possible to reduce an etching target amount in the second etching process P2 for removing the re-deposited conductive etch residue. Thus, it may be possible to mitigate and/or prevent or suppress an excessive etching of an upper portion of the lower interlayered insulating layer 102 on the peripheral circuit region PR, during the second etching process P2, and thereby to reduce a height difference between two portions of the lower interlayered insulating layer 102 located on the cell region CR and the peripheral circuit region PR (i.e., a difference between the first and second heights H1 and H2). In this case, it may be possible to reduce an aspect ratio of a peripheral contact plug to be described below and consequently to easily form the peripheral contact plug.

Figure 11:
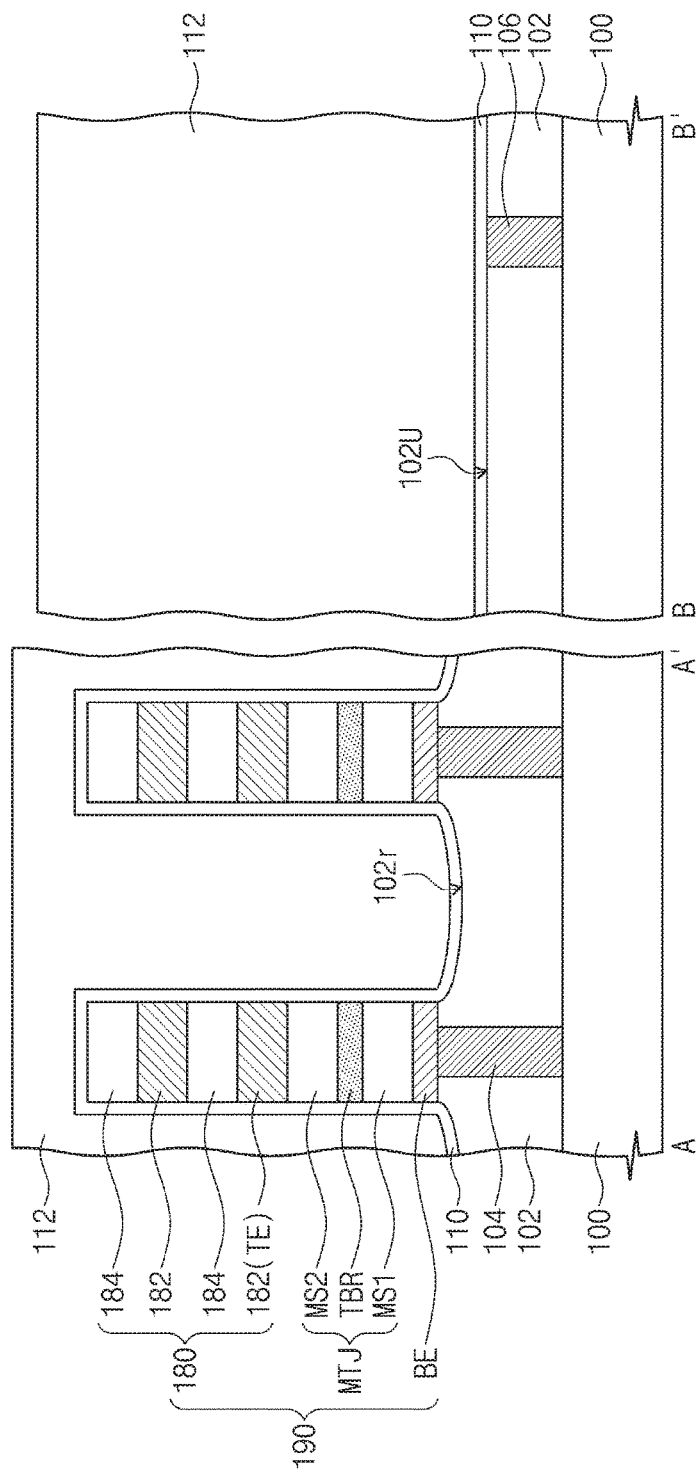

Referring to FIG. 11, a first protection layer 110 may be formed on the lower interlayered insulating layer 102 to cover top and side surfaces of the data storing structure 190 and to cover the lower interlayered insulating layer 102 between the data storing structures 190. Between adjacent ones of the data storing structures 190, the first protection layer 110 may be provided to cover the recessed top surface 102r of the lower interlayered insulating layer 102. On the peripheral circuit region PR, the first protection layer 110 may also cover the top surface 102U of the lower interlayered insulating layer 102. The first protection layer 110 may include a nitride layer (e.g., a silicon nitride layer).

A first interlayered insulating layer 112 may be formed on the first protection layer 110 to cover the data storing structure 190. The first protection layer 110 may be interposed between the top and side surfaces of the data storing structure 190 and the first interlayered insulating layer 112 and may be extended between the recessed top surface 102r of the lower interlayered insulating layer 102 and the first interlayered insulating layer 112. On the peripheral circuit region PR, the first protection layer 110 may be interposed between the lower interlayered insulating layer 102 and the first interlayered insulating layer 112. The first interlayered insulating layer 112 may be formed of or include oxide, nitride, and/or oxynitride.

Figure 12:
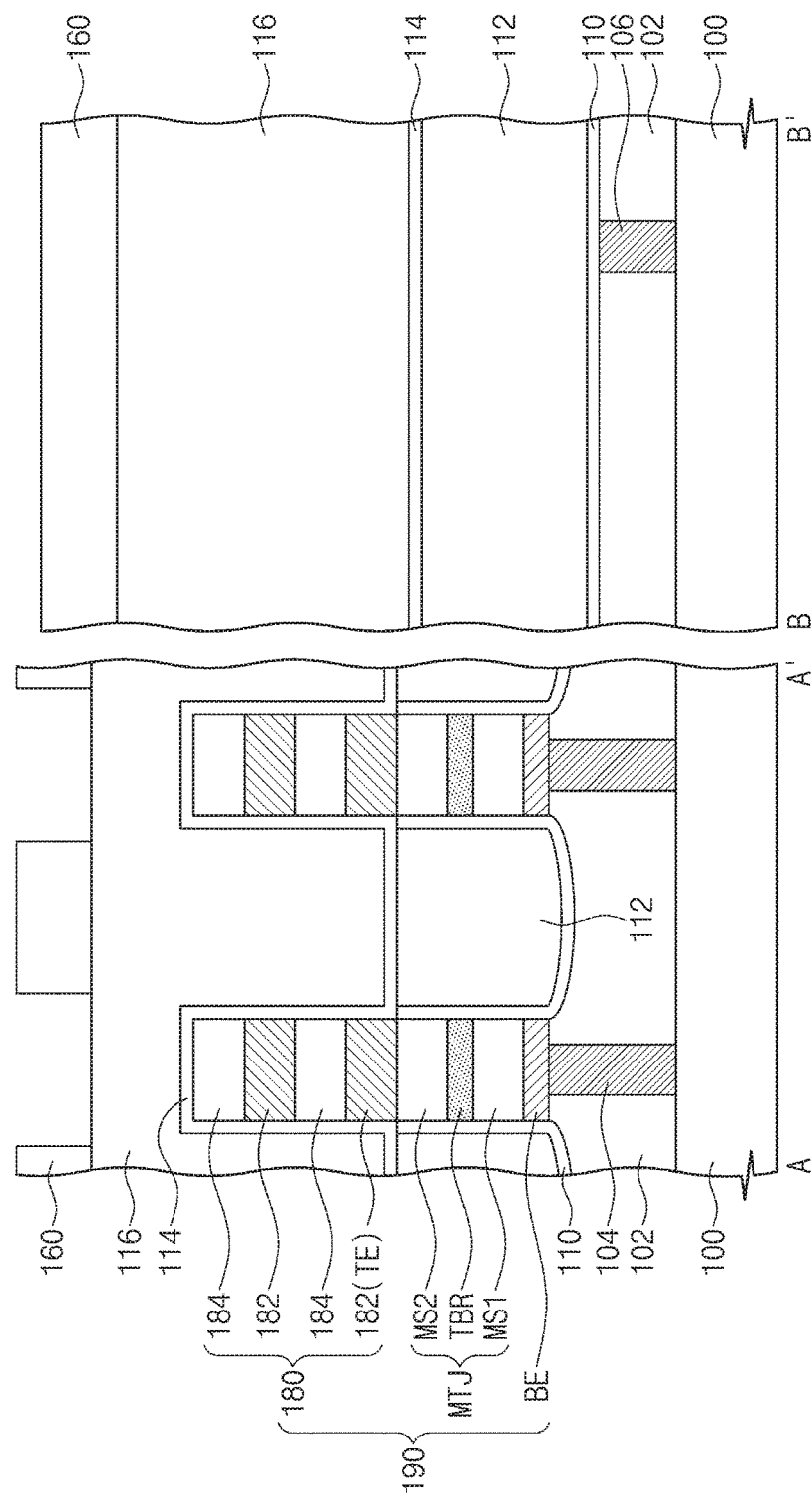

Referring to FIG. 12, the first interlayered insulating layer 112 and the first protection layer 110 may be etched to expose the mask structure 180. The etching process may be performed to expose the conductive pattern 182 (or the lowermost conductive pattern 182) of the mask structure 180, which is in contact with the magnetic tunnel junction pattern MTJ. Accordingly, a top surface of the first interlayered insulating layer 112 may be positioned at a level lower than that of the conductive pattern 182 (or the lowermost conductive pattern 182) of the mask structure 180, when measured from the top surface 100r of the substrate 100. For example, the etching process may be a dry etching process having an etch selectivity with respect to the mask structure 180.

A second protection layer 114 may be formed on the first interlayered insulating layer 112 to cover top and side surfaces of the mask structure 180 and to cover the first interlayered insulating layer 112 between the mask structures 180. The second protection layer 114 between the mask structures 180 may be in contact with the top surface of the first interlayered insulating layer 112 and the topmost surface of the first protection layer 110. The second protection layer 114 may be provided to be in contact with a side surface of the conductive pattern 182 (or the lowermost conductive pattern 182) of the mask structure 180 that is in contact with the magnetic tunnel junction pattern MTJ.

A second interlayered insulating layer 116 may be formed on the second protection layer 114 to cover the mask structure 180. The second protection layer 114 may be interposed between the top surface of the mask structure 180 and the second interlayered insulating layer 116 and between the side surface of the mask structure 180 and the second interlayered insulating layer 116. The second protection layer 114 may be extended between the second interlayered insulating layer 116 and the top surface of the first interlayered insulating layer 112, in a region between adjacent ones of the mask structures 180. On the peripheral circuit region PR, the second protection layer 114 may be interposed between the first interlayered insulating layer 112 and the second interlayered insulating layer 116. The second interlayered insulating layer 116 may be formed of or include oxide, nitride, and/or oxynitride, and the second protection layer 114 may be formed of or include an insulating material having an etch selectivity with respect to the second interlayered insulating layer 116. For example, in the case where the second interlayered insulating layer 116 includes silicon oxide, the second protection layer 114 may be formed of or include silicon nitride.

A contact mask pattern 160 may be formed on the second interlayered insulating layer 116. The contact mask pattern 160 may be used to define a position and a shape of an upper contact plug to be described below. The contact mask pattern 160 may include a material having an etch selectivity with respect to the second interlayered insulating layer 116 and the second protection layer 114.

Figure 13:
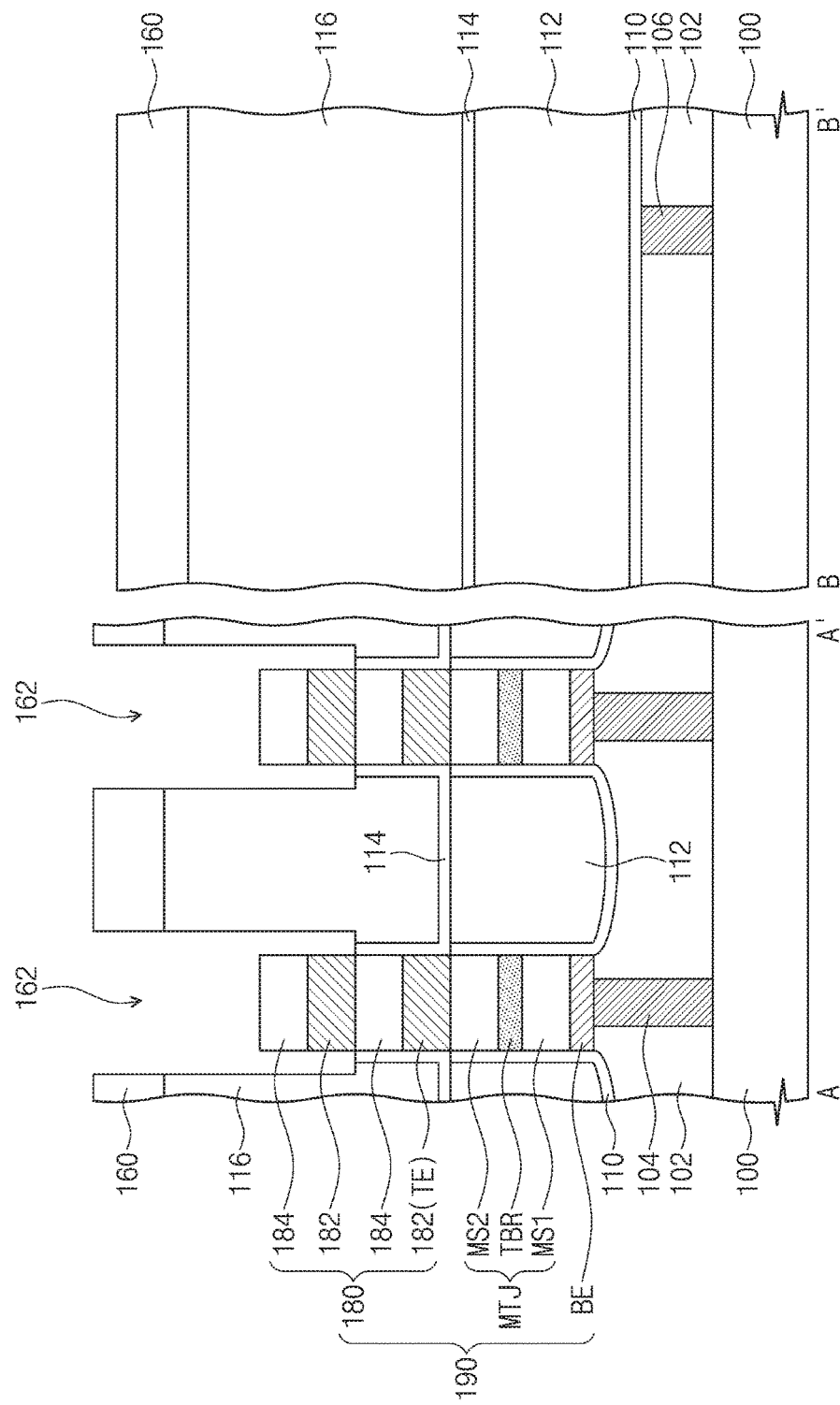

Referring to FIG. 13, the second interlayered insulating layer 116 and the second protection layer 114 may be etched using the contact mask pattern 160 as an etch mask, and thus, a preliminary opening 162 may be formed to expose an upper portion of the mask structure 180. For example, the preliminary opening 162 may be formed to expose an upper side surface of the mask structure 180.

Figure 14:
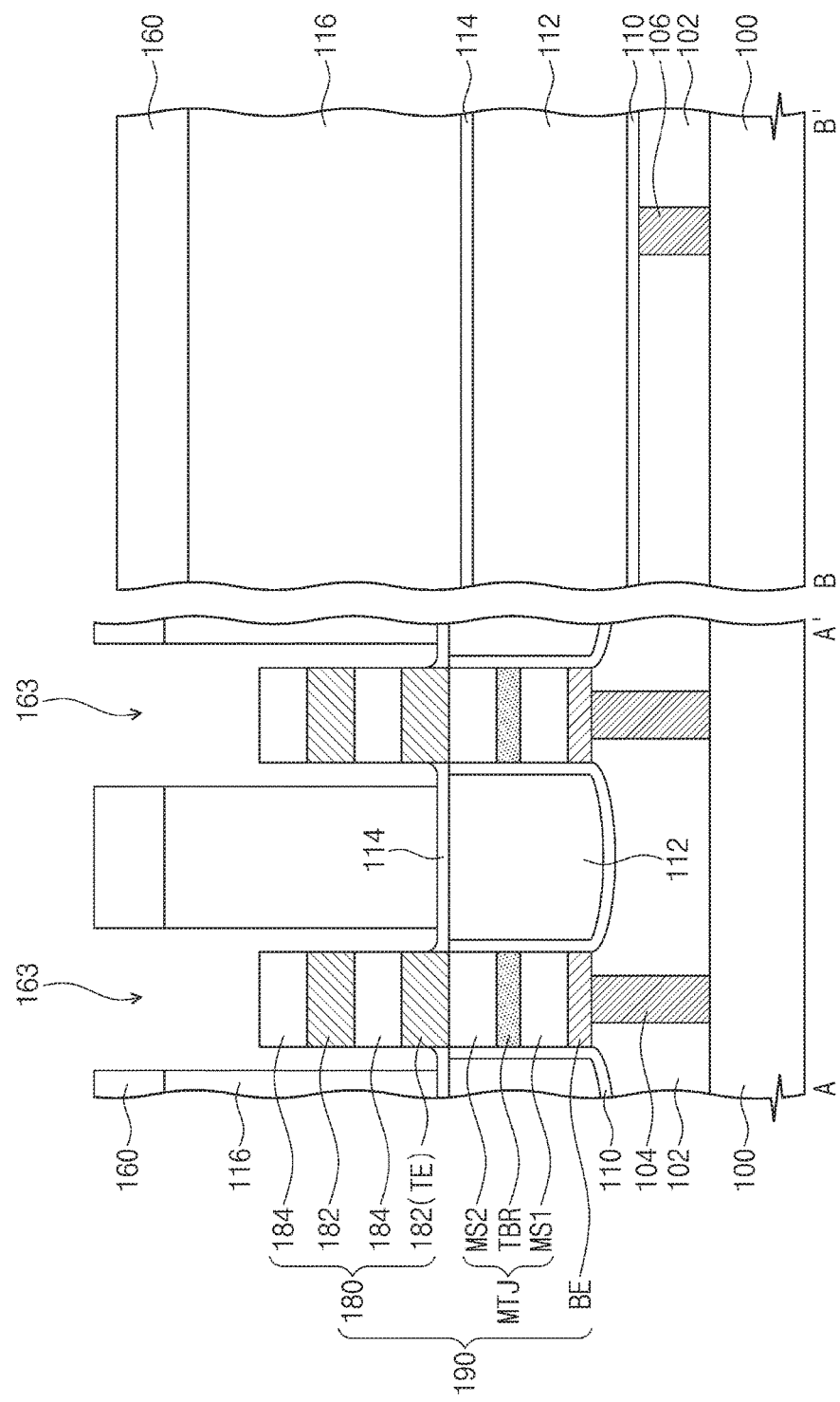

Referring to FIG. 14, the second interlayered insulating layer 116 exposed by the preliminary opening 162 may be etched using the contact mask pattern 160 as an etch mask, and thus, an opening 163 may be formed. The opening 163 may be formed by expanding the preliminary opening 162 toward the substrate 100. The formation of the opening 163 may include etching the second interlayered insulating layer 116 using an etching process having an etch selectivity with respect to the second protection layer 114. In other words, during the etching process, an etch rate of the second protection layer 114 may be lower than an etch rate of the second interlayered insulating layer 116. During the etching process, a portion of the second protection layer 114 may be etched to expose the side surface of the conductive pattern 182 (or the lowermost conductive pattern 182) of the mask structure 180 that is in contact with the magnetic tunnel junction pattern MTJ. In other words, the opening 163 may be formed to expose the side surface of the conductive pattern 182 (or the lowermost conductive pattern 182) of the mask structure 180. The second protection layer 114 may be used as an etch stop layer during the etching process. Accordingly, the second protection layer 114 may be interposed between the opening 163 and the first protection layer 110 and between the opening 163 and the first interlayered insulating layer 112. After the etching process, the second protection layer 114 may be in contact with the side surface of the conductive pattern 182 (or the lowermost conductive pattern 182) of the mask structure 180.

Figure 15:
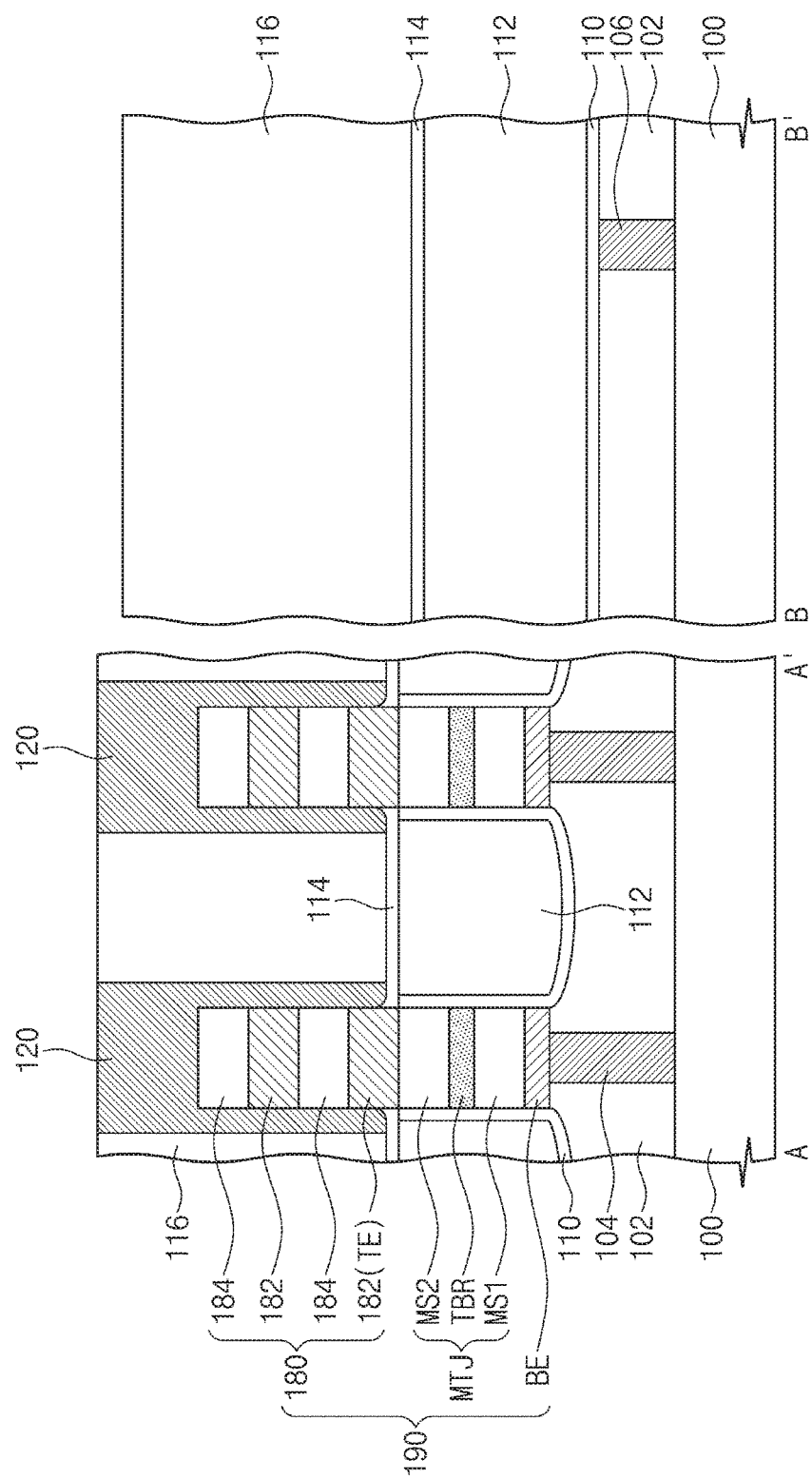

Referring to FIG. 15, the contact mask pattern 160 may be removed. Thereafter, an upper contact plug 120 may be formed in the opening 163. As an example, the formation of the upper contact plug 120 may include forming a conductive layer on the second interlayered insulating layer 116 to fill the opening 163 and planarizing the conductive layer to expose a top surface of the second interlayered insulating layer 116. As a result, the upper contact plug 120 may be locally formed in the opening 163. The upper contact plug 120 may be provided to cover not only a top surface of the mask structure 180 but also a side surface of the mask structure 180. When viewed in a plan view, the upper contact plug 120 may be provided to surround the side surface of the mask structure 180. The upper contact plug 120 may be in contact with the side surface of the conductive pattern 182 (or the lowermost conductive pattern 182) of the mask structure 180 and may be electrically coupled to the magnetic tunnel junction pattern MTJ via the conductive pattern 182. The upper contact plug 120 may be spaced apart from the first protection layer 110 and the first interlayered insulating layer 112 by the second protection layer 114. The upper contact plug 120 may be formed of or include at least one material of metallic materials (e.g., copper) and conductive metal nitrides.

Referring back to FIG. 4, a cell interconnection line 200C may be formed on the second interlayered insulating layer 116 of the cell region CR, and a peripheral interconnection line 200P may be formed on the second interlayered insulating layer 116 of the peripheral circuit region PR. A peripheral contact plug 122 may be formed between the peripheral interconnection line 200P and the substrate 100. The formation of the peripheral contact plug 122 may include forming a peripheral contact hole on the peripheral circuit region PR to penetrate the second interlayered insulating layer 116, the second protection layer 114, the first interlayered insulating layer 112, and the first protection layer 110 and then, forming the peripheral contact plug 122 in the peripheral contact hole. The peripheral contact hole may be provided to expose the top surface of the via contact 106, and the peripheral contact plug 122 may be electrically coupled to the substrate 100 through the via contact 106. Each of the cell interconnection line 200C, the peripheral interconnection line 200P, and the peripheral contact plug 122 may include at least one material of metals (e.g., copper) and conductive metal nitrides.

According to some example embodiments of the inventive concepts, due to the afore-described reduction in height difference between two portions of the lower interlayered insulating layer 102 located on the cell region CR and the peripheral circuit region PR, the peripheral contact plug 122 may be formed to have a reduced aspect ratio. This may make it easy to form the peripheral contact plug 122.

Figure 16:
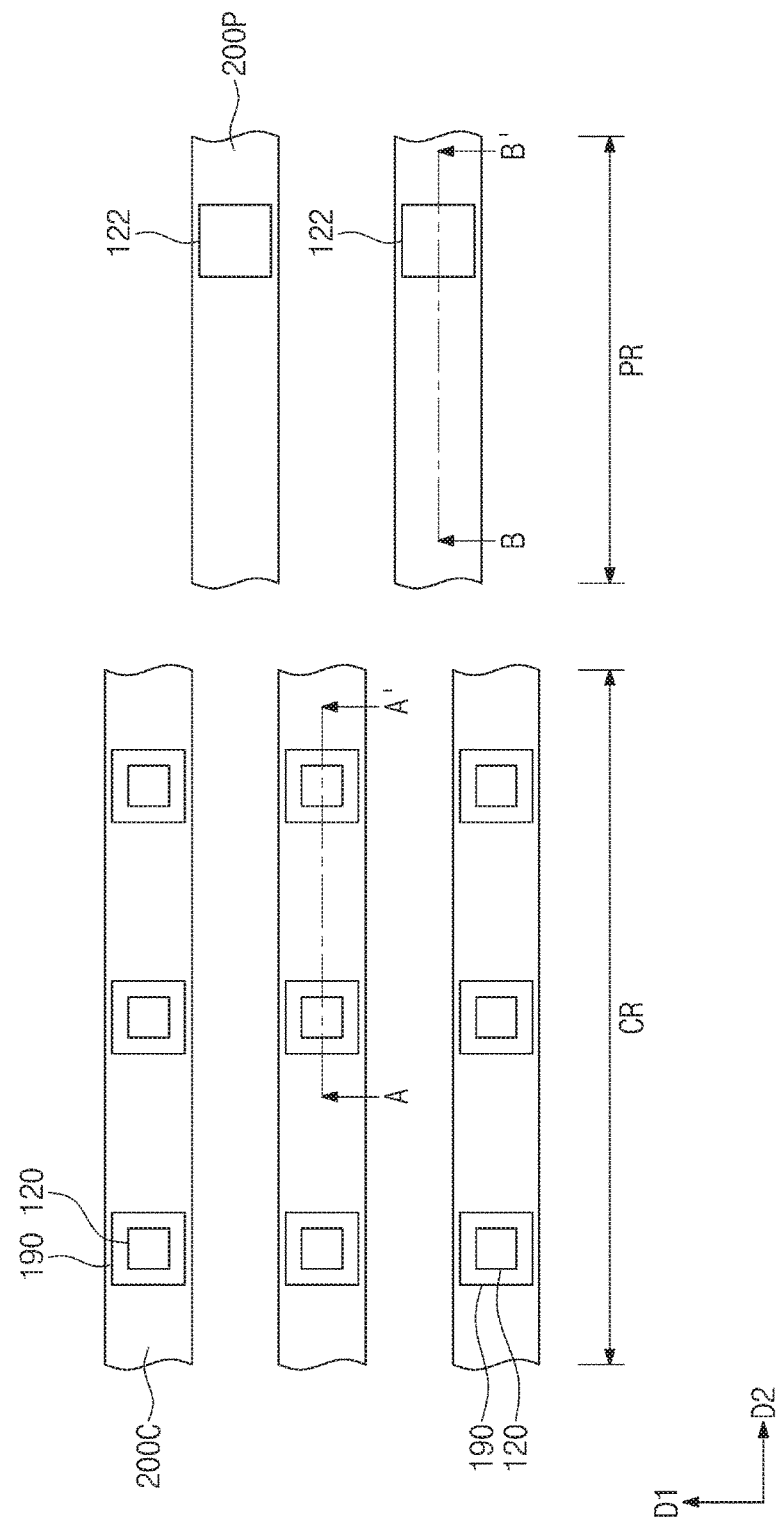
FIG. 16 is a plan view of a magnetic memory device according to some example embodiments of the inventive concepts.
Figure 17:
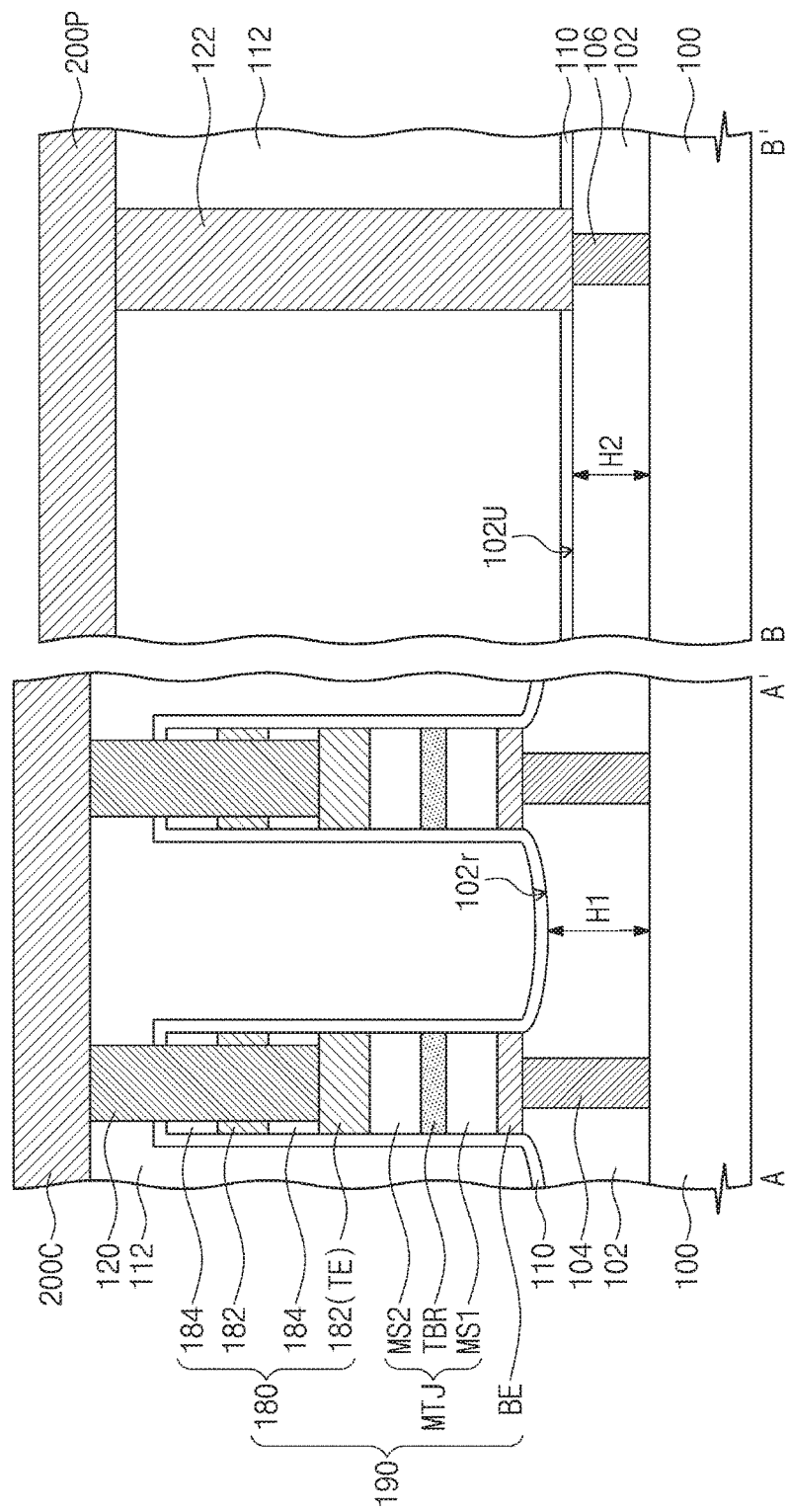
FIG. 17 is a sectional view taken along lines A-A' and B-B' of FIG. 16.

FIG. 16 is a plan view of a magnetic memory device according to some example embodiments of the inventive concepts, and FIG. 17 is a sectional view taken along lines A-A' and B-B' of FIG. 16. For concise description, an element previously described with reference to FIGS. 3 and 4 may be identified by a similar or identical reference number without repeating an overlapping description thereof.

Referring to FIGS. 16 and 17, the first interlayered insulating layer 112 may be provided on the lower interlayered insulating layer 102 to cover the data storing structures 190. The mask structure 180, the magnetic tunnel junction pattern MTJ, and the bottom electrode BE of each of the data storing structures 190 may be provided in the first interlayered insulating layer 112. For example, the magnetic tunnel junction pattern MTJ may extend at least partially through the first interlayered insulating layer 112. The first protection layer 110 may be interposed between the first interlayered insulating layer 112 and each of the data storing structures 190. The first protection layer 110 may be interposed between the mask structure 180 of each of the data storing structures 190 and the first interlayered insulating layer 112, between the magnetic tunnel junction pattern MTJ of each of the data storing structures 190 and the first interlayered insulating layer 112, and between the bottom electrode BE of each of the data storing structures 190 and the first interlayered insulating layer 112. The first protection layer 110 between the data storing structures 190 may be provided to cover the recessed top surface 102r of the lower interlayered insulating layer 102 and may be interposed between the lower interlayered insulating layer 102 and the first interlayered insulating layer 112.

An upper contact plug 120 may be provided to penetrate at least a portion of the first interlayered insulating layer 112 and may be connected to the mask structure 180. The upper contact plug 120 may be provided to penetrate at least a portion of the first protection layer 110 on the top surface of the mask structure 180 and may be connected to the mask structure 180. For example, the upper contact plug 120 may include at least a portion inserted into the mask structure 180. The mask structure 180 may cover bottom and side surfaces of the upper contact plug 120. When viewed in a plan view, the mask structure 180 may surround the side surface of the upper contact plug 120. The upper contact plug 120 may penetrate an upper portion of the mask structure 180 and may be in contact with the conductive pattern 182 (or the lowermost conductive pattern 182) of the mask structure 180, which is in contact with the magnetic tunnel junction pattern MTJ. The upper contact plug 120 may penetrate the first interlayered insulating layer 112, the first protection layer 110, and the sacrificial pattern 184. The upper contact plug 120 may be electrically coupled to the magnetic tunnel junction pattern MTJ via the conductive pattern 182 (or the lowermost conductive pattern 182). In other words, the conductive pattern 182 (or the lowermost conductive pattern 182) may serve as a top electrode TE.

Figure 18:
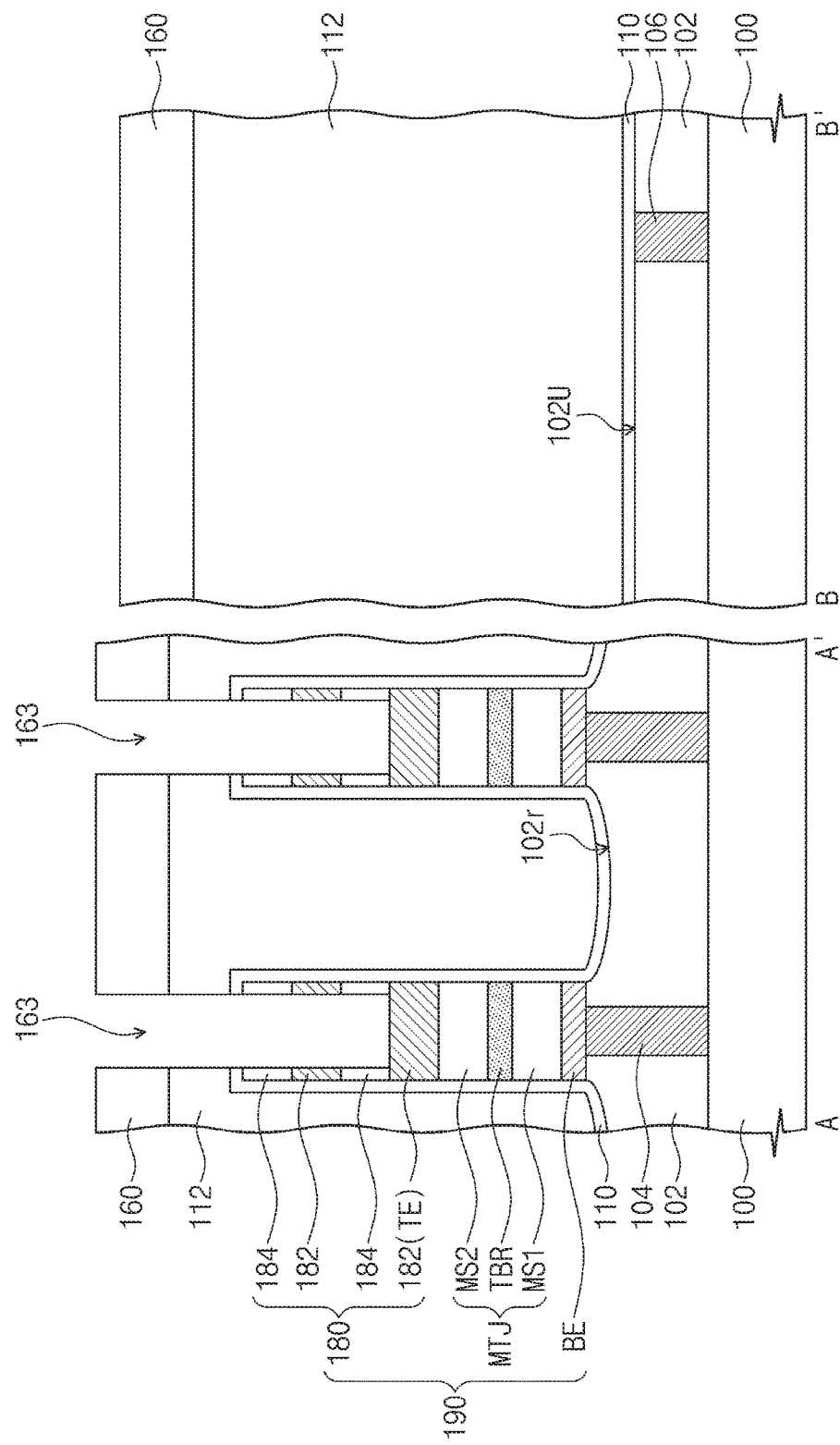
FIG. 18 is a sectional view, which is provided to illustrate a method of fabricating a magnetic memory device according to some example embodiments of the inventive concepts and is taken along lines A-A' and B-B' of FIG. 16.

FIG. 18 is a sectional view, which is provided to illustrate a method of fabricating a magnetic memory device according to some example embodiments of the inventive concepts and corresponds to be taken along lines A-A' and B-B' of FIG. 16. For concise description, an element or step previously described with reference to FIGS. 5 to 15 may be identified by a similar or identical reference number without repeating an overlapping description thereof.

As described with reference to FIGS. 5 to 11, the first protection layer 110 may be formed on the lower interlayered insulating layer 102 to cover top and side surfaces of the data storing structure 190 and to cover the lower interlayered insulating layer 102 between the data storing structures 190. Between adjacent ones of the data storing structures 190, the first protection layer 110 may be provided to cover the recessed top surface 102r of the lower interlayered insulating layer 102. On the peripheral circuit region PR, the first protection layer 110 may also cover the top surface 102U of the lower interlayered insulating layer 102.

The first interlayered insulating layer 112 may be formed on the first protection layer 110 to cover the data storing structure 190. The first protection layer 110 may be interposed between the top and side surfaces of the data storing structure 190 and the first interlayered insulating layer 112, and may be extended between the recessed top surface 102r of the lower interlayered insulating layer 102 and the first interlayered insulating layer 112. On the peripheral circuit region PR, the first protection layer 110 may be interposed between the lower interlayered insulating layer 102 and the first interlayered insulating layer 112.

Referring to FIG. 18, a contact mask pattern 160 may be formed on the first interlayered insulating layer 112. The contact mask pattern 160 may be used to define a position and a shape of an upper contact plug to be described below. The contact mask pattern 160 may include a material having an etch selectivity with respect to the first interlayered insulating layer 112, the first protection layer 110, the sacrificial pattern 184, and the conductive pattern 182. The first interlayered insulating layer 112, the first protection layer 110, and an upper portion of the mask structure 180 may be etched using the contact mask pattern 160 as an etch mask. Accordingly, an opening 163 may be formed to penetrate the upper portion of the mask structure 180. When viewed in a plan view, the opening 163 may be an empty region surrounded by the mask structure 180. The etching process for forming the opening 163 may be performed to expose the conductive pattern 182 (or the lowermost conductive pattern 182) of the mask structure 180, which is in contact with the magnetic tunnel junction pattern MTJ. The opening 163 may be formed to expose a top surface of the conductive pattern 182 (or the lowermost conductive pattern 182) of the mask structure 180.

Referring back to FIG. 17, the contact mask pattern 160 may be removed. Thereafter, an upper contact plug 120 may be formed in the opening 163. The formation of the upper contact plug 120 may include forming a conductive layer on the first interlayered insulating layer 112 to fill the opening 163 and planarizing the conductive layer to expose a top surface of the first interlayered insulating layer 112. As a result, the upper contact plug 120 may be locally formed in the opening 163.

Figure 19:
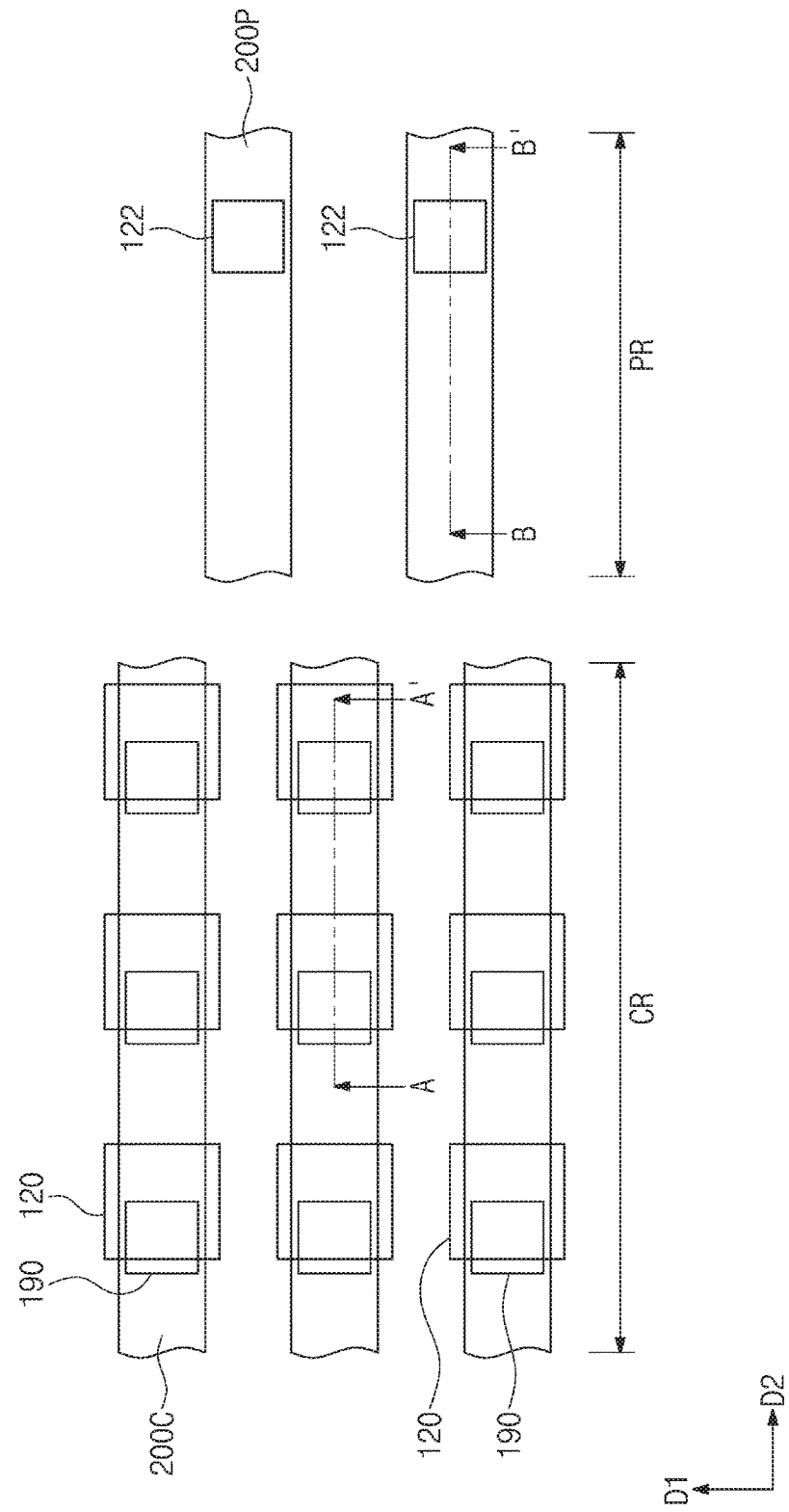
FIG. 19 is a plan view of a magnetic memory device according to some example embodiments of the inventive concepts.
Figure 20:
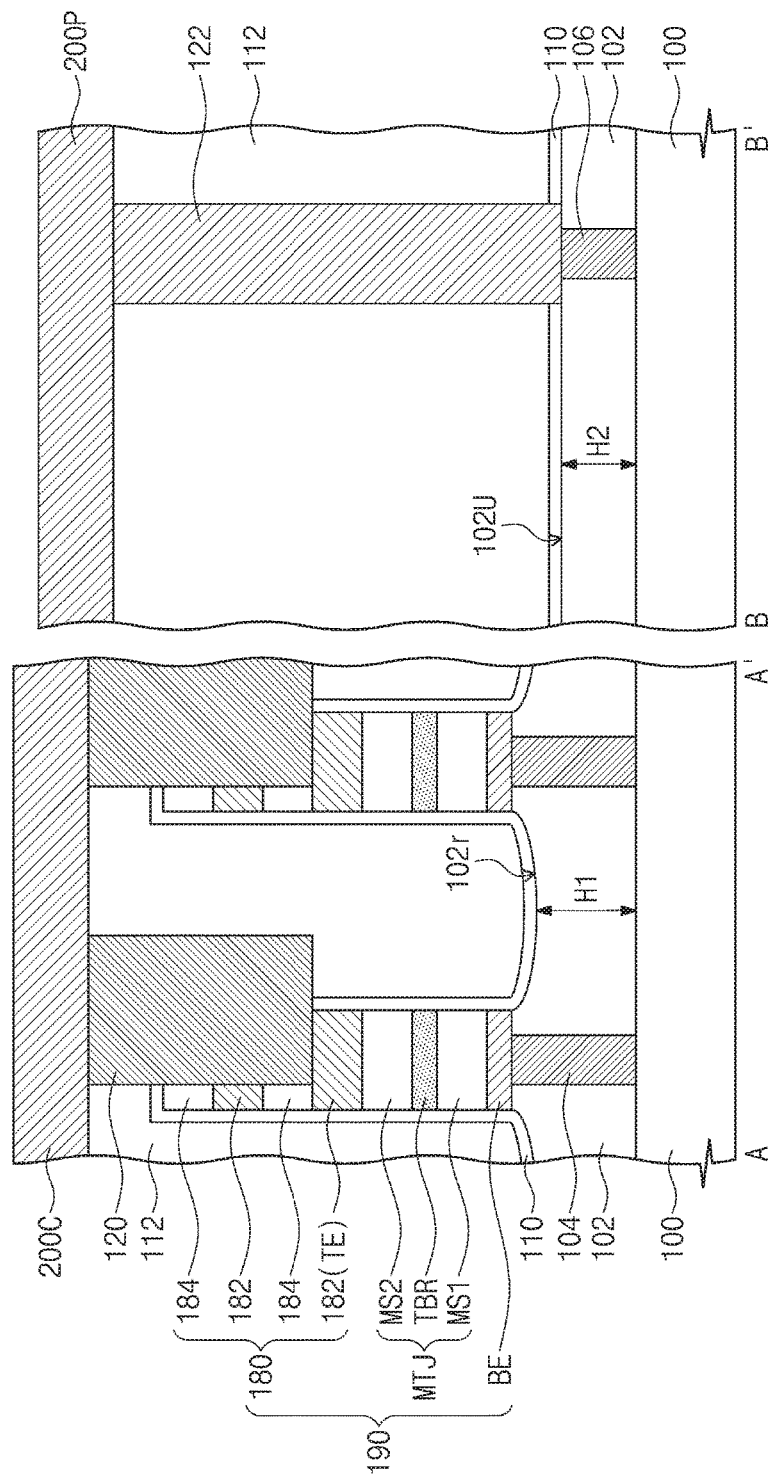
FIG. 20 is a sectional view taken along lines A-A' and B-B' of FIG. 19.

FIG. 19 is a plan view of a magnetic memory device according to some example embodiments of the inventive concepts, and FIG. 20 is a sectional view taken along lines A-A' and B-B' of FIG. 19. For concise description, an element previously described with reference to FIGS. 3 and 4 may be identified by a similar or identical reference number without repeating an overlapping description thereof.

Referring to FIGS. 19 and 20, the first interlayered insulating layer 112 may be provided on the lower interlayered insulating layer 102 to cover the data storing structures 190. The mask structure 180, the magnetic tunnel junction pattern MTJ, and the bottom electrode BE of each of the data storing structures 190 may be provided in the first interlayered insulating layer 112. The first protection layer 110 may be interposed between the first interlayered insulating layer 112 and each of the data storing structures 190. The first protection layer 110 may be interposed between the mask structure 180 of each of the data storing structures 190 and the first interlayered insulating layer 112, between the magnetic tunnel junction pattern MTJ of each of the data storing structures 190 and the first interlayered insulating layer 112, and between the bottom electrode BE of each of the data storing structures 190 and the first interlayered insulating layer 112. The first protection layer 110 between the data storing structures 190 may be provided to cover the recessed top surface 102r of the lower interlayered insulating layer 102 and may be interposed between the lower interlayered insulating layer 102 and the first interlayered insulating layer 112.

An upper contact plug 120 may be provided to penetrate at least a portion of the first interlayered insulating layer 112 and may be connected to the mask structure 180. The upper contact plug 120 may be provided to penetrate at least a portion of the first protection layer 110 on the top and side surfaces of the mask structure 180. The upper contact plug 120 may penetrate an upper portion of the mask structure 180 and may be in contact with the conductive pattern 182 (or the lowermost conductive pattern 182) of the mask structure 180, which is in contact with the magnetic tunnel junction pattern MTJ. The upper contact plug 120 may be in contact with a top surface of the conductive pattern 182 (or the lowermost conductive pattern 182) of the mask structure 180. The upper contact plug 120 may include a side surface, which is in contact with the upper portion of the mask structure 180, and another side surface, which is in contact with the first interlayered insulating layer 112. The upper contact plug 120 may be provided to be offset from the data storing structure 190 in a direction parallel to the top surface 100r of the substrate 100 (e.g., in the second direction D2).

Figure 21:
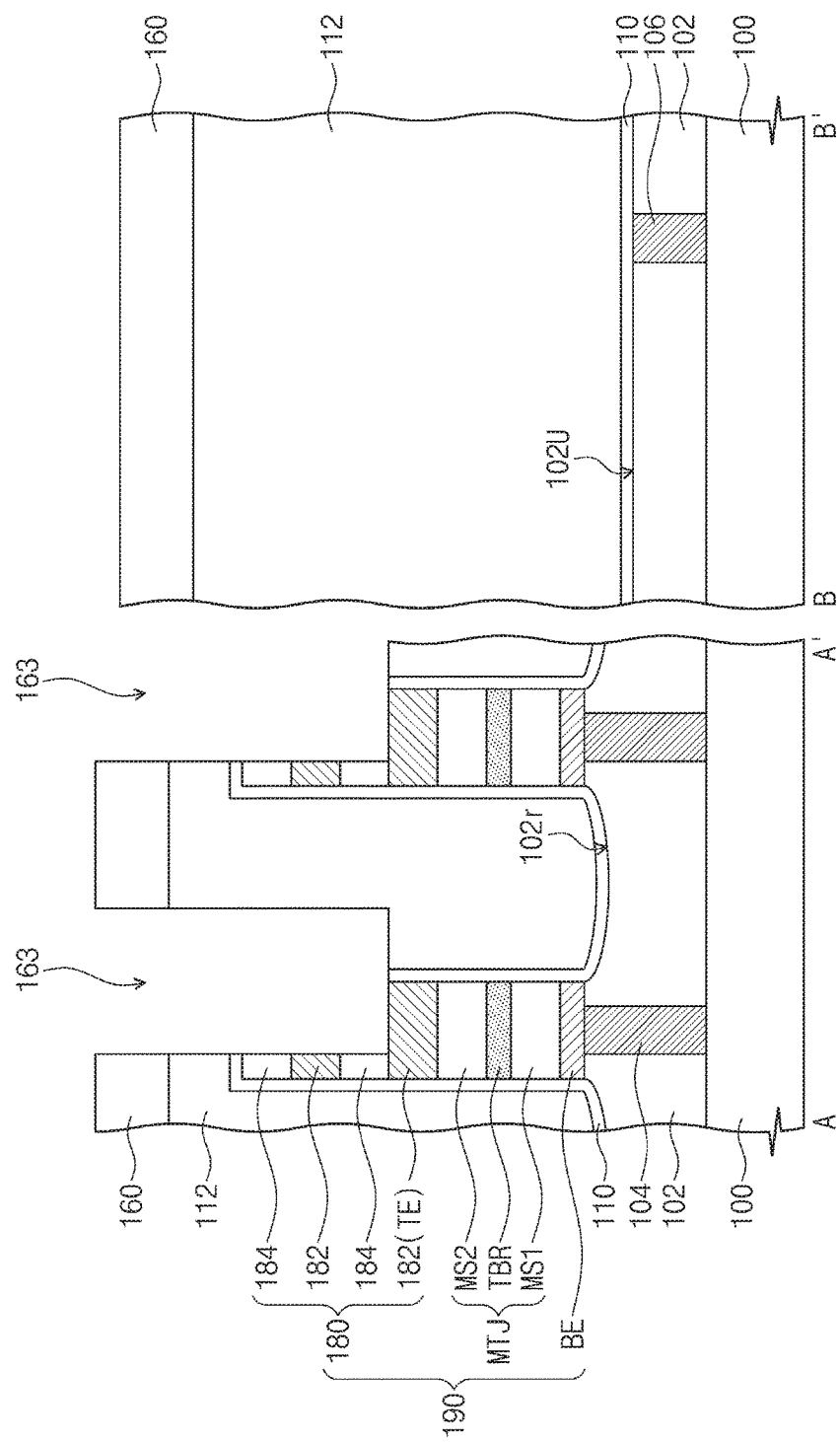
FIG. 21 is a sectional view, which is provided to illustrate a method of fabricating a magnetic memory device according to some example embodiments of the inventive concepts and is taken along lines A-A' and B-B' of FIG. 19.

FIG. 21 is a sectional view, which is provided to illustrate a method of fabricating a magnetic memory device according to some example embodiments of the inventive concepts and corresponds to be taken along lines A-A' and B-B' of FIG. 19. For concise description, an element or step previously described with reference to FIGS. 5 to 15 may be identified by a similar or identical reference number without repeating an overlapping description thereof.

As described with reference to FIGS. 5 to 11, the first protection layer 110 may be formed on the lower interlayered insulating layer 102 to cover top and side surfaces of the data storing structure 190 and to cover the lower interlayered insulating layer 102 between the data storing structures 190. Between adjacent ones of the data storing structures 190, the first protection layer 110 may be provided to cover the recessed top surface 102r of the lower interlayered insulating layer 102. On the peripheral circuit region PR, the first protection layer 110 may also cover the top surface 102U of the lower interlayered insulating layer 102. The first interlayered insulating layer 112 may be formed on the first protection layer 110 to cover the data storing structure 190. The first protection layer 110 may be interposed between the top and side surfaces of the data storing structure 190 and the first interlayered insulating layer 112 and may be extended between the recessed top surface 102r of the lower interlayered insulating layer 102 and the first interlayered insulating layer 112. On the peripheral circuit region PR, the first protection layer 110 may be interposed between the lower interlayered insulating layer 102 and the first interlayered insulating layer 112.

Referring to FIG. 21, a contact mask pattern 160 may be formed on the first interlayered insulating layer 112. The contact mask pattern 160 may be used to define a position and a shape of an upper contact plug to be described below. The contact mask pattern 160 may include a material having an etch selectivity with respect to the first interlayered insulating layer 112, the first protection layer 110, the sacrificial pattern 184, and the conductive pattern 182. The first interlayered insulating layer 112, the first protection layer 110, and an upper portion of the mask structure 180 may be etched using the contact mask pattern 160 as an etch mask. Accordingly, an opening 163 may be formed to penetrate the upper portion of the mask structure 180. The opening 163 may be formed to be offset from the data storing structure 190 in a direction parallel to the top surface 100r of the substrate 100 (e.g., in the second direction D2). Accordingly, the opening 163 may penetrate at least a portion of the first interlayered insulating layer 112 located between adjacent ones of the data storing structures 190. The etching process for forming the opening 163 may be performed to expose the conductive pattern 182 (or the lowermost conductive pattern 182) of the mask structure 180, which is in contact with the magnetic tunnel junction pattern MTJ. The opening 163 may be formed to expose a top surface of the conductive pattern 182 (or the lowermost conductive pattern 182) of the mask structure 180.

Referring back to FIG. 20, the contact mask pattern 160 may be removed. Thereafter, an upper contact plug 120 may be formed in the opening 163. The formation of the upper contact plug 120 may include forming a conductive layer on the first interlayered insulating layer 112 to fill the opening 163 and planarizing the conductive layer to expose a top surface of the first interlayered insulating layer 112. As a result, the upper contact plug 120 may be locally formed in the opening 163.

According to some example embodiments of the inventive concepts, the mask structure 180 may be provided on the magnetic tunnel junction pattern MTJ, and the mask structure 180 may include the at least one conductive pattern 182 and the at least one sacrificial pattern 184, which are stacked on the magnetic tunnel junction pattern MTJ. The sacrificial pattern 184 may be formed of or include at least one material of silicon oxide, silicon nitride, silicon oxynitride, and metal oxide. Since the mask structure 180 has a multi-layered structure including the conductive pattern 182 and the sacrificial pattern 184, it may be possible to reduce an amount of conductive etch residues, which is produced from the mask structure 180 during an etching process for forming the magnetic tunnel junction pattern MTJ. Accordingly, it may be possible to reduce an amount of the conductive etch residues to be re-deposited on the side surface of the magnetic tunnel junction pattern MTJ and consequently to suppress or mitigate and/or prevent occurrence of short circuits in the magnetic tunnel junction pattern MTJ.

In addition, since the re-deposition amount of the conductive etch residues is reduced, it may be possible to decrease an etching target amount in an additional etching process for removing the re-deposited conductive etch residues. Accordingly, it may be possible to mitigate and/or prevent an excessive etching of an upper portion of the lower interlayered insulating layer 102, which is located on the peripheral circuit region PR, during the additional etching process, and consequently to reduce a height difference between two portions of the lower interlayered insulating layer 102, which are respectively located on the cell region CR and the peripheral circuit region PR. As a result, the peripheral contact plug 122 may be formed to have a reduced aspect ratio, and thus, a process of forming the peripheral contact plug 122 may be performed with ease.

Accordingly, it may be possible to easily fabricate a magnetic memory device with improved electric characteristics.

While example embodiments of the inventive concepts have been particularly shown and described, it will be understood by one of ordinary skill in the art that variations in form and detail may be made therein without departing from the spirit and scope of the attached claims.

What is claimed is:
1. A device, comprising:
a magnetic tunnel junction pattern on a substrate;
a mask structure including a conductive pattern and a sacrificial pattern, the conductive pattern between the magnetic tunnel junction pattern and the sacrificial pattern, the sacrificial pattern including a material having an etch selectivity with respect to the conductive pattern, the mask structure including an outer side surface, the outer side surface of the mask structure including an outer side surface of the conductive pattern and an outer side surface of the sacrificial pattern; and
an upper contact plug in contact with at least the outer side surface of the conductive pattern, wherein the upper contact plug is configured to at least partially encompass the mask structure, such that the upper contact plug at least partially extends along a top surface of the mask structure and at least partially extends along the outer side surface of the mask structure to be in contact with the outer side surface of the conductive pattern.

2. The device of claim 1, wherein,
the conductive pattern is in contact with the magnetic tunnel junction pattern, and
the upper contact plug is electrically coupled to the magnetic tunnel junction pattern through the conductive pattern.

3. The device of claim 1, wherein,
the mask structure includes an alternating stack of patterns on the magnetic tunnel junction pattern, the alternating stack of patterns including a plurality of conductive patterns and a plurality of sacrificial patterns,
the plurality of conductive patterns includes a lowermost conductive pattern that is in contact with the magnetic tunnel junction pattern, and
the upper contact plug is in contact with a surface of the lowermost conductive pattern.

4. The device of claim 1, wherein the conductive pattern includes at least one material of metals and conductive metal nitrides.

5. The device of claim 1, further comprising:
a first interlayered insulating layer on the substrate, the magnetic tunnel junction pattern extending at least partially through the first interlayered insulating layer;
a second interlayered insulating layer on the first interlayered insulating layer, the mask structure extending at least partially through the second interlayered insulating layer;
a first protection layer between the magnetic tunnel junction pattern and the first interlayered insulating layer; and
a second protection layer between the first interlayered insulating layer and the second interlayered insulating layer, the second protection layer in contact with a side surface of the conductive pattern,
wherein the upper contact plug penetrates at least a portion of the second interlayered insulating layer and is in contact with the side surface of the conductive pattern.

6. The device of claim 5, wherein the conductive pattern is in contact with the magnetic tunnel junction pattern.

7. The device of claim 6, wherein,
the second protection layer is between the upper contact plug and the first interlayered insulating layer,
the second protection layer is between the upper contact plug and the first protection layer, and the second protection layer is in contact with the side surface of the conductive pattern.

8. The device of claim 7, wherein the second protection layer is at least partially between the side surface of the conductive pattern and the upper contact plug.

9. The device of claim 5, further comprising:
a lower interlayered insulating layer between the substrate and the first interlayered insulating layer; and
a lower contact plug in the lower interlayered insulating layer and connected to the magnetic tunnel junction pattern,
wherein the first protection layer is between a side surface of the magnetic tunnel junction pattern and the first interlayered insulating layer, and the first protection layer is between the lower interlayered insulating layer and the first interlayered insulating layer.

10. The device of claim 5, wherein the second protection layer includes a material having an etch selectivity with respect to the second interlayered insulating layer.

11. A device, comprising:
a substrate, the substrate including a cell region and a peripheral circuit region;
a lower interlayered insulating layer covering the cell region and the peripheral circuit region of the substrate;
a plurality of magnetic tunnel junction patterns on the lower interlayered insulating layer and on the cell region, the plurality of magnetic tunnel junction patterns spaced apart from each other in a direction parallel to a top surface of the substrate; and
a plurality of mask structures on separate, respective magnetic tunnel junction patterns of the plurality of magnetic tunnel junction patterns,
wherein each mask structure of the plurality of mask structures includes a conductive pattern and a sacrificial pattern,
each sacrificial pattern of the plurality of mask structures includes a material having an etch selectivity with respect to the conductive pattern of the plurality of mask structures, respectively,
the lower interlayered insulating layer on the cell region has a recessed top surface between adjacent magnetic tunnel junction patterns of the plurality of magnetic tunnel junction patterns, the recessed top surface recessed toward the substrate,
the lower interlayered insulating layer on the peripheral circuit region has a top surface that is lower than the recessed top surface, when measured from the top surface of the substrate.

12. The device of claim 11, wherein,
a lowermost point of the recessed top surface is at a first height from the substrate,
the top surface of the lower interlayered insulating layer on the peripheral circuit region is at a second height from the substrate, and
a difference between the first height and the second height is greater than 0□ and is smaller than or equal to 400□.

13. The device of claim 11, further comprising:
a plurality of lower contact plugs in the lower interlayered insulating layer and on the cell region, the plurality of lower contact plugs connected to separate, respective magnetic tunnel junction patterns of the plurality of magnetic tunnel junction patterns;
a via contact in the lower interlayered insulating layer and on the peripheral circuit region;
a peripheral interconnection line on the lower interlayered insulating layer and on the peripheral circuit region; and
a peripheral contact plug between the lower interlayered insulating layer and the peripheral interconnection line, the peripheral contact plug electrically coupling the peripheral interconnection line to the via contact,
wherein a topmost surface of the via contact is at a level lower than a level of a topmost surface of each lower contact plug of the plurality of lower contact plugs, when measured from the top surface of the substrate.

14. A device, comprising:
a magnetic tunnel junction pattern on a substrate; and
a mask structure including a conductive pattern and a sacrificial pattern, the conductive pattern between the magnetic tunnel junction pattern and the sacrificial pattern, the sacrificial pattern including a material having an etch selectivity with respect to the conductive pattern,
wherein the mask structure includes an alternating stack of patterns on the magnetic tunnel junction pattern and extending in a direction perpendicular to a top surface of the substrate, the alternating stack of patterns including a plurality of conductive patterns and a plurality of sacrificial patterns, such that the alternating stack of patterns includes at least one conductive pattern of the plurality of conductive patterns between separate sacrificial patterns of the plurality of sacrificial patterns and the alternating stack of patterns further includes at least one sacrificial pattern of the plurality of sacrificial patterns between separate conductive patterns of the plurality of conductive patterns,
wherein the plurality of conductive patterns includes a lowermost conductive pattern that is in contact with the magnetic tunnel junction pattern.

15. The device of claim 14, wherein the conductive pattern includes at least one material of metals and conductive metal nitrides.

16. The device of claim 14, wherein the sacrificial pattern includes at least one material of silicon oxide, silicon nitride, silicon oxynitride, and metal oxide.

17. The device of claim 14, further comprising:
a first interlayered insulating layer on the substrate, the magnetic tunnel junction pattern extending at least partially through the first interlayered insulating layer;
a second interlayered insulating layer on the first interlayered insulating layer, the mask structure extending at least partially through the second interlayered insulating layer;
a first protection layer between the magnetic tunnel junction pattern and the first interlayered insulating layer; and
a second protection layer between the first interlayered insulating layer and the second interlayered insulating layer, the second protection layer in contact with a side surface of the conductive pattern.

* * * * *